(12) United States Patent
Romero et al.

(10) Patent No.: US 7,518,414 B2
(45) Date of Patent: *Apr. 14, 2009

(54) TRACK-AND-HOLD PEAK DETECTOR CIRCUIT

(75) Inventors: Hernan D. Romero, Buenos Aires (AR); Jay M. Towne, Newbury, NH (US); Jeff Eagen, Amherst, NH (US); Karl Scheller, Bow, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 17 days.

This patent is subject to a terminal disclaimer.

(21) Appl. No.: 11/216,651

(22) Filed: Aug. 31, 2005

(65) Prior Publication Data

US 2006/0125531 A1    Jun. 15, 2006

Related U.S. Application Data

(63) Continuation-in-part of application No. 11/010,704, filed on Dec. 13, 2004, now Pat. No. 7,053,674.

(60) Provisional application No. 60/673,466, filed on Apr. 21, 2005.

(51) Int. Cl.
*G11C 27/02* (2006.01)
(52) U.S. Cl. .................................. 327/96; 327/58
(58) Field of Classification Search .................. 327/91, 327/93–96
See application file for complete search history.

(56) References Cited

U.S. PATENT DOCUMENTS

| | | | | |
|---|---|---|---|---|
| 5,025,176 A | * | 6/1991 | Takeno | 327/58 |
| 5,442,283 A | | 8/1995 | Vig et al. | |
| 5,828,240 A | * | 10/1998 | Smith | 327/62 |
| 5,923,219 A | | 7/1999 | Ide et al. | |
| 5,936,457 A | * | 8/1999 | Liao et al. | 327/514 |
| 5,952,824 A | | 9/1999 | Shinjo et al. | |
| 6,051,998 A | * | 4/2000 | Lee et al. | 327/59 |
| 6,177,814 B1 | * | 1/2001 | Taguchi | 327/58 |
| 6,774,617 B2 | * | 8/2004 | Andoh | 324/103 P |

FOREIGN PATENT DOCUMENTS

EP    0 621 460 A1    10/1994

OTHER PUBLICATIONS

PCT Search Report and Written Opinion of the ISA for PCT/US2005/034815 dated Jul. 26, 2006.

* cited by examiner

*Primary Examiner*—Donovan Lincoln
*Assistant Examiner*—Terry L Englund
(74) *Attorney, Agent, or Firm*—Daly, Crowley, Mofford & Durkes, LLP

(57) ABSTRACT

A track-and-hold peak detector circuit, which can operate at low input signal frequencies, includes a capacitor to hold a peak voltage of the input signal and logic circuitry that reduces an effect of leakage current into or out of the capacitor, and therefore, provides protection against self-switching of an output signal of the peak detector circuit.

24 Claims, 14 Drawing Sheets

TRACK-AND-HOLD PEAK DETECTOR CIRCUIT

CROSS REFERENCE TO RELATED APPLICATIONS

This application claims the benefit under 35 U.S.C. §119(e) of U.S. Provisional Application No. 60/673,466 filed Apr. 21, 2005. This application is also a Continuation-in-Part application of and claims the benefit under 35 U.S.C. §120 of U.S. application Ser. No. 11/010,704 filed on Dec. 13, 2004, now U.S. Pat. No. 7,053,674, issued May 30, 2006. The above-identified applications and patent are incorporated herein by reference in their entirety.

STATEMENT REGARDING FEDERALLY SPONSORED RESEARCH

Not Applicable.

FIELD OF THE INVENTION

This invention relates to track-and-hold peak detector circuits and, more particularly, to track-and-hold peak detector circuits that use a capacitor to hold a voltage.

BACKGROUND OF THE INVENTION

Track-and-hold peak detector circuits having a capacitor to hold a voltage corresponding to an input signal are known. In conventional track-and-hold peak detector circuits, or more simply, peak detector circuits, it is known that the voltage on the capacitor tends to drift with time due to leakage currents in the capacitor itself and also due to leakage currents in circuitry surrounding the capacitor.

Conventional proximity sensors are also known, which can detect, for example, peaks and/or thresholds associated with an output signal generated by one or more magnetic field sensors in response to presence or absence of a ferrous object, for example, a tooth of a ferrous gear, or in response to presence or absence of a magnet. Within the proximity sensor, the conventional peak detector circuit can be used, to reduce the effect of a DC offset in an output signal provided by one or more magnetic field sensors, e.g., Hall effect sensors. With this arrangement, the peak detector circuit can allow the Hall effect sensors to more accurately detect peaks (and/or thresholds) associated with an AC portion of a signal generated by the Hall effect sensors in response to the passing gear teeth.

In some applications, for example, automobile applications, a proximity sensor and associated peak detector circuit may be required to operate at low input signal frequencies (e.g., one Hz) and high temperatures (e.g., 150 C). As is known, high temperatures tend to result in relatively high leakage currents, and therefore, a relatively high voltage drift in a voltage held on a capacitor used in the peak detector circuit.

A conventional peak detector circuit, particularly when operating with a low input signal frequency, requires a capacitor with a large capacitance value (typically about 0.1 uf at 10 Hz) in order to accurately hold a voltage in the presence of the leakage currents. As is known, large capacitors are not readily integrated onto a common substrate with other circuitry. Therefore, the conventional peak detector circuit often requires use of an external capacitor. Use of the external capacitor increases sensitivity of the peak detector circuit to electrical noise from external noise sources, which can degrade accuracy and repeatability of the peak detector circuit. The external capacitor also tends to be undesirably large and can also be costly.

Referring now to FIG. 1, a conventional peak detector circuit 10 includes a capacitor 20 having a threshold node 20a. The conventional peak detector circuit 10 also includes a charging circuit 14 having a charging circuit input node 14a to receive an input signal 12 and a charging circuit output node 14b coupled to the threshold node 20a. The conventional peak detector circuit 10 still further includes a comparator 24 having a first comparator input node 24a coupled to the threshold node 20a, a second comparator input node 24b coupled to the charging circuit input node 14a, and a comparator output node 24c.

In operation, the charging circuit 14 provides a charging signal at the charging circuit output node 14b to charge the capacitor 20 to a voltage in accordance the input signal 12. For example, as the input signal 12 rises in voltage, the voltage at the charging circuit output node 14b rises accordingly, charging the capacitor 20 to a voltage according to the input voltage 12. However, because the charging circuit 14 is unable to discharge the capacitor 20, as the input signal 12 falls in voltage, the voltage at the capacitor 20 holds the last highest voltage of the input signal.

The comparator 24 provides a comparator output signal 26 at the comparator output node 24c in response to a voltage difference, Vc−Vi, between the voltage, Vc, at the threshold node 20a and the voltage, Vi, of the input signal 12. The comparator 24 can be arranged having two thresholds to provide hysteresis. As described above, the capacitor 20 holds the peak voltage of the input signal 12 at the threshold node 20a. When the input signal 12 thereafter begins to transition to a lower voltage, crossing an upper comparator threshold (as Vc−Vi increases), a change in state occurs at the comparator output node 24c. The change in state at the comparator output node 24c can be used to detect a peak of the input signal 12.

As described above, a voltage held on the capacitor 20 tends to drift. It will be understood that the voltage drift on the capacitor 20 is generally in a positive direction due to a leakage current 19 through the transistor 18. Therefore, an input signal 12 having a constant or decreasing voltage in combination with an increasing voltage at the holding capacitor 20 due to voltage drift can results in a false change in state at the comparator output node 24c (also referred to here as a self-switching). Furthermore, an input signal having a decreasing voltage in combination with a decreasing voltage at the holding capacitor 20 for example, in the presence of a negative voltage drift, can result in a change in state that is delayed in relation to that which would occur with no voltage drift.

The above-described self-switching is discussed in U.S. Pat. No. 5,442,283, issued Aug. 15, 1995, entitled "Hall-Voltage Slope-Activated Sensor," which is assigned to the assignee of the present invention. The described sensor uses a dual-polarity peak detector. However, the dual-polarity peak detector is also subject to self-switching.

In order to reduce or avoid self-switching, a compensation circuit 28 can provide a compensation current 27 at the threshold node 20a in opposition to the leakage current 19 through the transistor 18, reducing the voltage drift on the capacitor 20. However, because the leakage current 19 through the transistor 18 is only approximately known, and is also known to vary with temperature as described above, the applied compensation current 27 does not exactly compensate for the leakage current 19 at all temperatures.

The compensation circuit 28 can reduce a peak detection accuracy of the peak detector circuit 10. For example, a compensating current 27 that is too high (i.e., over compensated) produces an undesired voltage drift in the opposite direction (negative direction) during a holding time (i.e., the transistor 18 is off), and tends to reduce a detection accuracy of the peak of the input signal 12.

Furthermore, the compensation current 27 can affect a minimum operating frequency of the peak detector circuit 10. For example, after a positive peak of the input signal 12 has passed, if a negative rate of change of the input signal 12 signal is less than or equal to the overcompensated voltage drift (also in the negative direction), then a peak in the input signal 12 will not be detected at all. A negative rate of change of the overcompensated capacitor voltage is related to the minimum operating frequency of the peak detector.

Use of the compensation circuit 28 to provide the compensation current 27 opposing the leakage current 19 through the transistor 18 results in a trade-off between self-switching reduction and the minimum operating frequency at which the peak detector circuit 10 can operate properly. The larger the required compensation current 27 used to avoid self switching, the larger the potential overcompensation and the higher the minimum operating frequency become.

From the above discussion, it should be apparent that prior art peak detector arrangements used to reduce self-switching are not suitable for low-frequency high-temperature operation. Furthermore, having an external holding capacitor, prior art peak detectors tend to be relatively large.

SUMMARY OF THE INVENTION

In accordance with the present invention, a circuit includes a capacitor having a threshold node. The circuit also includes a track-and-hold circuit adapted to track an input signal and to hold a capacitor voltage on the threshold node in accordance with peaks of the input signal, wherein the track-and-hold circuit has an output node at which an output signal is provided in accordance with the peaks of the input signal. The circuit further includes a logic circuit adapted to provide a logic circuit output signal having a transition indicative of a slope of the capacitor voltage, wherein the logic circuit output signal is adapted to control the track-and-hold circuit.

In accordance with another aspect of the present invention, a circuit includes a capacitor having a threshold node. The circuit also includes at least one of: a charging circuit having a charging circuit input node to receive an input signal and a charging circuit output node coupled to the threshold node, wherein the charging circuit is adapted to provide a charging signal at the charging circuit output node to charge the capacitor to a capacitor-positive-peak voltage in accordance with a positive peak of the input signal, the charging circuit further having a charging-circuit-slope node at which a charging-circuit-slope signal is provided indicative of a slope of the capacitor-positive-peak voltage, and a discharging circuit having a discharging circuit input node to receive an input signal and a discharging circuit output node coupled to the threshold node, wherein the discharging circuit is adapted to provide a discharging signal at the discharging circuit output node to discharge the capacitor to a capacitor-negative-peak voltage in accordance with a negative peak of the input signal, the discharging circuit further having a discharging-circuit-slope node at which a discharging-circuit-slope signal is provided indicative of a slope of the capacitor-negative-peak voltage.

The circuit also includes a comparator having a first comparator input node coupled to the threshold node, a second comparator input node coupled to the input node of the at least one of the charging circuit and the discharging circuit, and a comparator output node at which a comparator output signal is provided. The circuit still further includes a first logic circuit having at least one first logic circuit input node coupled to at least one of the charging-circuit-slope node and the discharging-circuit-slope node and having a first logic circuit output node at which a first logic circuit output signal is provided indicative of a slope of at least one of the capacitor-positive-peak voltage and the capacitor-negative-peak voltage. The circuit yet further includes a second logic circuit having a second logic circuit input node coupled to the comparator output node, another second logic circuit input node coupled to the first logic circuit output node, and a second logic circuit output node at which a second logic circuit output signal is provided indicative of a predetermined period of time during which the comparator output signal has no transitions and further in response to a predetermined period of time during which the at least one of the capacitor-positive-peak voltage and the capacitor-negative-peak voltage has a slope approximately equal to zero.

In accordance with another aspect of the present invention, a circuit includes a first capacitor having a first threshold node and a second capacitor having a second threshold node. The circuit also includes a charging/discharging circuit having at least two charging/discharging circuit input nodes to receive an input signal and an inverted input signal, at least two charging/dischargingcircuit output nodes coupled respectively to the first threshold node and to the second threshold node, and an enable/disable node, wherein the charging/discharging circuit is adapted to provide charging signals at the at least two charging/discharging circuit output nodes to charge the first capacitor to a first-capacitor-positive-peak voltage in accordance with a positive peak of the input signal and to charge the second capacitor to a second-capacitor-positive-peak voltage in accordance with a positive peak of the inverted input signal, and wherein the charging/discharging circuit is adapted to provide discharging signals at the at least two charging/discharging circuit output nodes to discharge the first capacitor to a first-capacitor-negative-peak voltage in accordance with a negative peak of the input signal and to discharge the second capacitor to a second-capacitor-negative-peak voltage in accordance with a negative peak of the inverted input signal, wherein the charging/discharging circuit further has at least one charging/discharging-circuit-slope node at which a respective at least one charging/discharging-circuit-slope signal is provided indicative of a slope of at least one of the first-capacitor-positive-peak voltage, the second-capacitor-positive-peak voltage, the first-capacitor-negative-peak voltage, and the second-capacitor-negative-peak voltage. The circuit further includes a comparator having first differential comparator input nodes coupled to the first and second threshold nodes, second differential comparator input nodes coupled to respective ones of the at least two charging/discharging circuit input nodes, and a comparator output node at which a comparator output signal is provided. The circuit yet further includes a first logic circuit having at least one first logic circuit input node coupled to the at least one charging/discharging-circuit-slope node and having a first logic circuit output node at which a first logic circuit output signal is provided in response to a slope of the at least one of the first-capacitor-positive-peak voltage, the second-capacitor-positive-peak voltage, the first-capacitor-negative-peak voltage, and the second-capacitor-negative-peak voltage. The circuit yet further includes a second logic circuit having a second logic circuit input node coupled to the comparator output node, another second logic circuit input node coupled to the first logic circuit output node, and a second logic circuit output node coupled to the enable/disable node, wherein a second logic circuit output signal is provided at the second logic circuit output node in response to a predetermined period of time during which the comparator output signal has no transitions and further in response to a predetermined period of time during which the at least one of the first-capacitor-positive-peak voltage, the second-capacitor-positive-peak voltage, the first-capacitor-negative-peak voltage, and the second-capacitor-negative-peak voltage has a slope approximately equal to zero.

With the above arrangements, circuits are provided that can avoid the effect of a voltage drift on a capacitor used in a peak detector circuit. By avoiding the effect of the voltage drift, the capacitor can be made smaller in value, size, and cost, while maintaining a very low operating frequency.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the peak detector circuit, some introductory concepts and terminology are explained. As used herein, the term "proximity sensor" refers to a circuit that can detect peaks and/or thresholds associated with an output signal generated by one or more magnetic field sensors in response to presence or absence of a ferrous object, for example, a tooth of a ferrous gear, or in response to presence or absence of a magnet.

Figure 1:
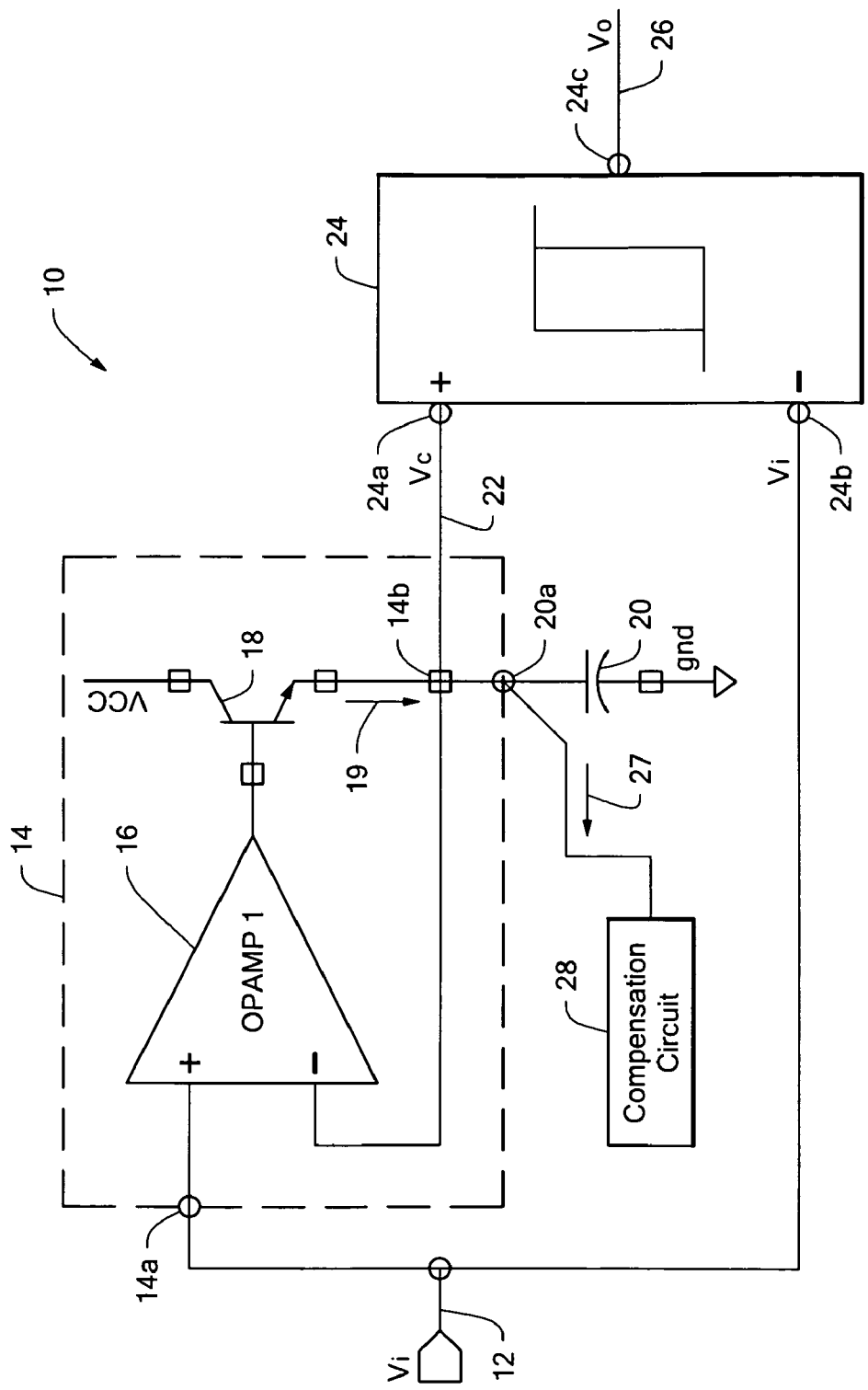
FIG. 1 is a block diagram of a prior art circuit.
Figure 2:
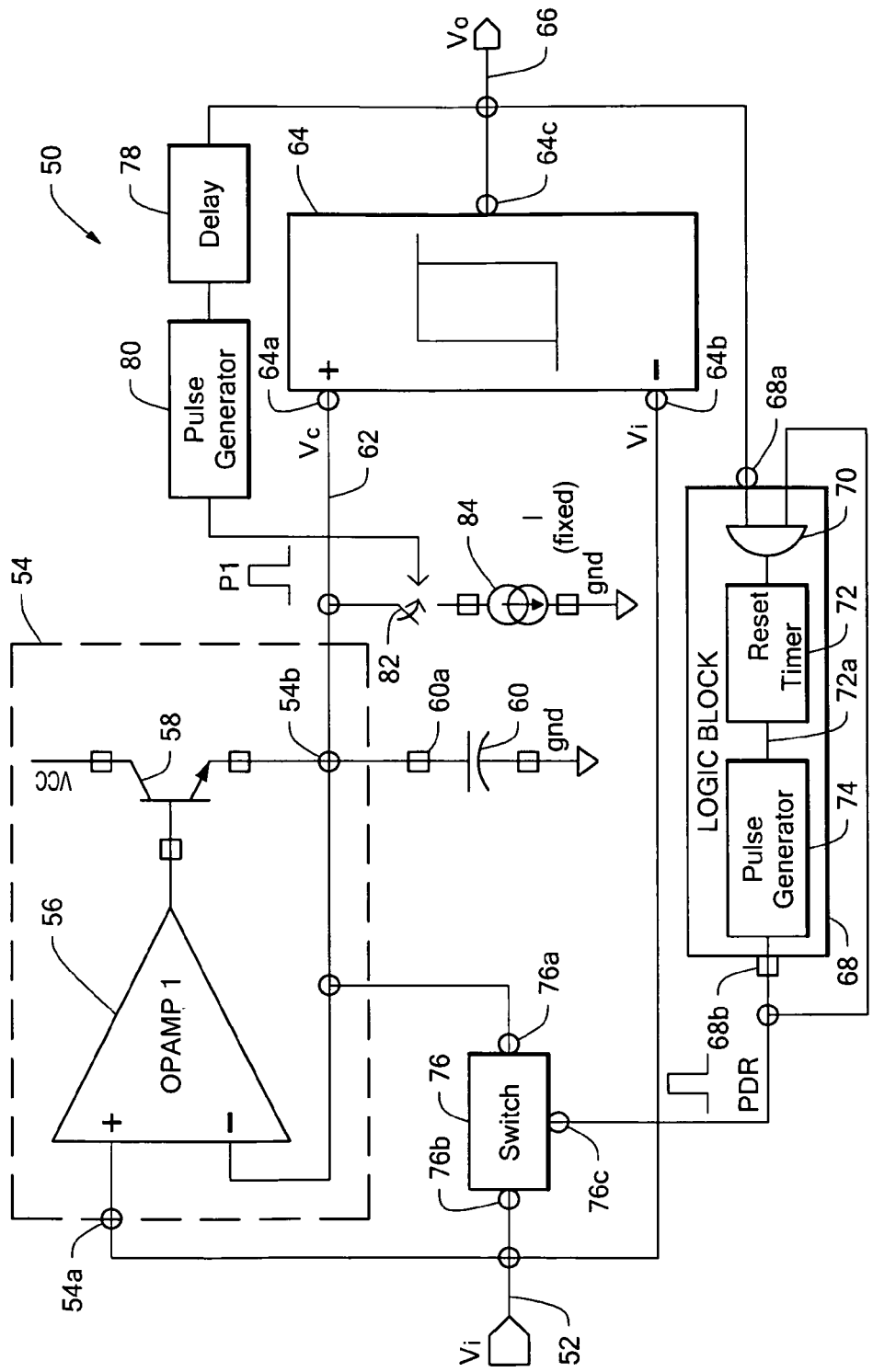
FIG. 2 is a block diagram of a circuit able to detect positive peaks of an input signal in accordance with the present invention.

Referring to FIG. 2, a circuit 50 includes a capacitor 60 having a threshold node 60a. The circuit 50 also includes a charging circuit 54 having a charging circuit input node 54a to receive an input signal 52 and a charging circuit output node 54b coupled to the threshold node 60a. The circuit 50 is responsive to positive peaks of the input signal 52. A similar circuit, which is responsive to negative peaks of the input signal, is shown below in FIG. 9.

The circuit 50 also includes a comparator 64 having a first comparator input node 64a coupled to the threshold node 60a, a second comparator input node 64b coupled to the charging circuit input node 54a, and a comparator output node 64c at which a comparator output signal 66 is provided. The comparator 64 provides the comparator output signal 66 at the comparator output node 64c in response to a voltage difference, Vc−Vi, between a voltage, Vc, at the threshold node 60a and a voltage, Vi, of the input signal 52. The comparator 64 can be arranged having two thresholds to provide hysteresis, an upper threshold and a lower threshold.

The circuit 50 still further includes a logic circuit 68 having a logic circuit input node 68a coupled to the comparator output node 64c and a logic circuit output node 68b at which a logic circuit output signal, also referred to herein as a "peak detector reset" (PDR) signal, is provided in response to a predetermined period of time during which the comparator output signal 66 has no transitions. The circuit 50 still further includes a switch 76 having a first switch node 76a coupled to the threshold node 60a, a second switch node 76b coupled to the charging circuit input node 54a, and a switch control node 76c coupled to the logic circuit output node 68b. In some embodiments, the circuit 50 also includes a delay module 78, a pulse generator 80, a switch 82, and a current source 84.

In some embodiments, the charging circuit 54 includes an amplifier 56 and a transistor 58. In some further embodiments, the logic circuit 68 includes a gate 70, a timer 72, and a pulse generator 74 (monostable multivibrator). Also, in some embodiments, at least the capacitor 60, the charging circuit 54, the comparator 64, the logic circuit 68, and the switch 76 are provided on a common substrate.

In operation, the charging circuit 54 provides a charging signal at the charging circuit output node 54b to charge the capacitor 60 to a voltage in accordance with a positive peak of the input signal 52. The charging circuit 54 can only charge the capacitor 60. Therefore, upon reaching the positive peak voltage of the input signal 52, the capacitor 60 holds the positive peak voltage of the input signal 52 at the threshold node 60a. When the input signal 52 thereafter begins to transition to a lower voltage, causing the voltage difference, Vc−Vi, to increase and cross the upper threshold of the comparator 64, a change in state, for example, a change to a high state, occurs at the comparator output node 64c. Therefore, the change in state at the comparator output node 64c can be used to detect a first positive peak of the input signal 52.

The pulse generator 80 generates pulse, P1, shortly after each transition of the output signal 66 to a high state, at a time in accordance with the delay module 78. The pulse, P1, operates via the switch 82 and the current source 84 to move the voltage at the threshold node 60a slightly downward. The shift in voltage at the threshold node 60a results in the comparator output signal 66 taking on a low state (i.e., resetting the comparator 64) when the input signal 52 reaches the voltage at the threshold node 60a. The circuit 50, therefore, becomes ready to detect the next positive peak of the input signal 52. The above-described resetting of the comparator 64 will be further understood from the discussion below in conjunction with FIG. 4.

In a first mode of operation of the logic circuit 68, achieved when the input signal 52 is varying in voltage, the logic circuit 68 generates a steady state (DC) PDR signal (e.g., a low state) at the logic circuit output node 68b. In the first mode of operation, the timer 72 is repeatedly reset by changes in state of the comparator output signal 66 caused by the varying input voltage 52, resulting in the continual low state at the logic circuit output node 68b. In this mode of operation, the switch 76 remains open and the circuit 50 operates as described above.

In a second mode of operation of the logic circuit 68, achieved when the input signal 52 is slowly varying or DC, the logic circuit 68 generates a PDR signal having high and low states (i.e., PDR pulses) at the output node 68b. In this mode of operation, the output of the comparator 64 either has transitions widely spaced in time or no transitions, respectively, resulting in either widely spaced resets to the timer 72 or no resets, respectively. Taking, for example, a DC input signal 52, which results in no resets applied to the timer 72, the timer 72 counts up to a terminal count in a predetermined amount of time, at which time an output 72a of the timer 72 makes a transition, causing the pulse generator 74 (e.g., monostable multivibrator) to output a high state PDR signal (a PDR pulse) at the logic circuit output node 68b.

The PDR signal is received by the switch 76 at the switch control node 76c. During a time when the PDR signal is in the high state, i.e., during the PDR pulse, the capacitor 60 is coupled to the input signal 52 by way of the switch 76, forcing the voltage on the capacitor 60 (which may otherwise be experiencing voltage drift) to substantially equal the voltage of the input signal 52, and therefore, forcing the voltage at the threshold node 60a, to take on the voltage of the input signal 52 (i.e., Vc−Vi=0). It will be recognized that this condition prevents switching of the comparator 64.

The PDR signal is also coupled to a gate 70 and forces the timer 72 to reset according to a state of the PDR signal. When the PDR pulse terminates (i.e., the state at the node 68b returns to its original state), the timer 72 again counts, again reaching its terminal count after the predetermined time and another PDR pulse is generated. With this arrangement, the logic circuit 68 continually generates PDR pulses so long as the input signal 52 remains generally unchanged. It will be recognized that PDR pulses can also be generated for an input signal 52 that is slowly varying.

In the second mode of operation of the logic circuit 68, during a time when the PDR signal is at a low state, i.e., between PDR pulses, the circuit 50 operates as described above in the first mode of operation of the logic circuit 68.

When in the above-described second mode of operation of the logic circuit 68, self-switching of the comparator 64 is reduced or eliminated so long as the voltage at the threshold node 60a is not allowed to deviate very far from the voltage of the input signal 52, which can be accomplished by generating PDR pulses sufficiently close together. The above-described reduction of self-switching will be further understood from the discussion below in conjunction with FIG. 3.

Figure 3:
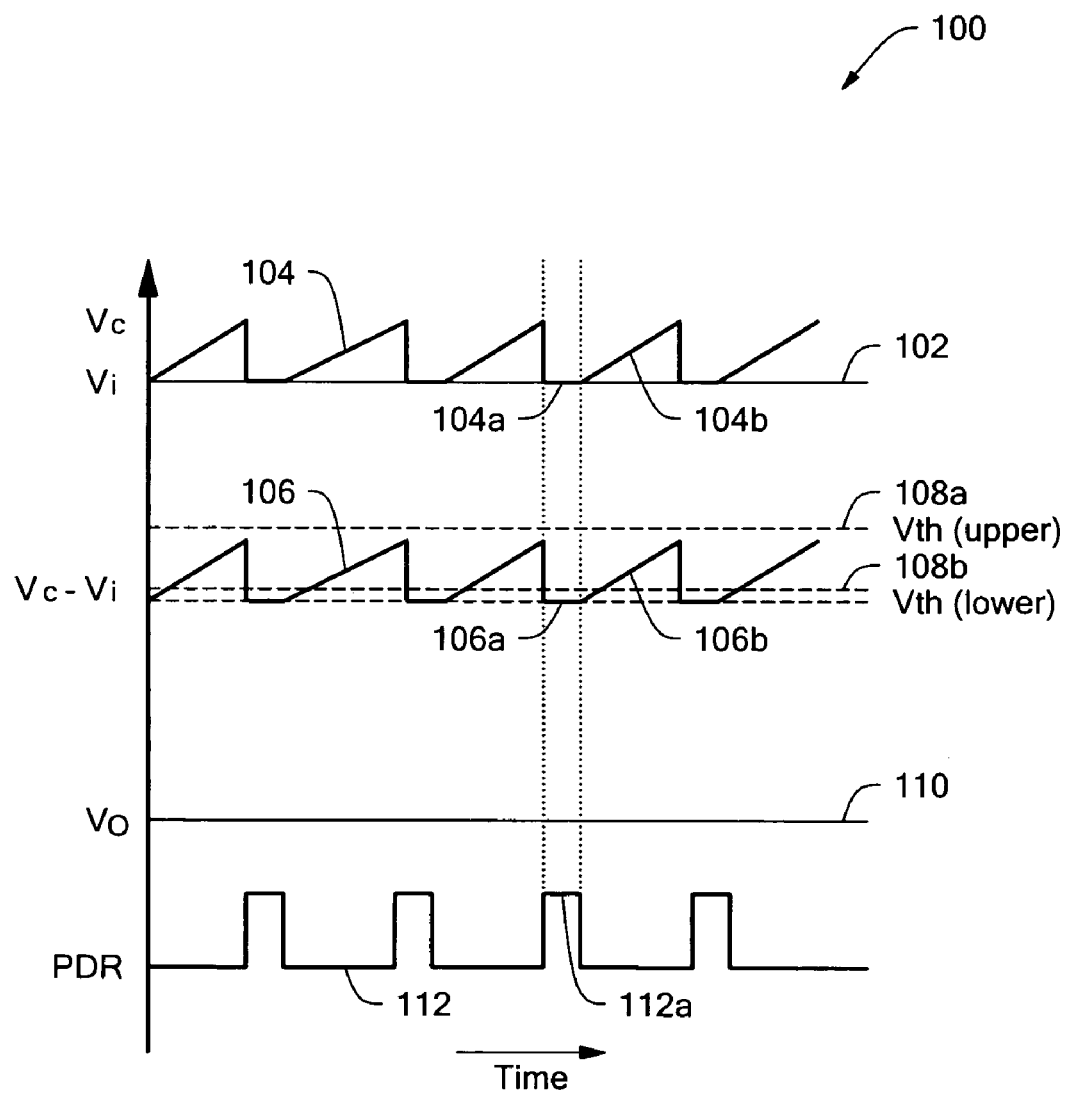
FIG. 3 is a graph showing details of the operation of the circuit of FIG. 2.

Referring now to FIG. 3, a graph 100 has a horizontal scale in units of time and vertical scales in units of voltage. A curve 102 is indicative of a DC input voltage 52 (FIG. 2). A curve 104 is representative of a voltage appearing at the threshold node 60a of FIG. 2 when the logic circuit 68 of FIG. 2 is operating in the above-described second mode of operation. The curve 104 has flat portions, of which a flat portion 104a is but one example, and sloping portions, of which a sloping portion 104b is but one example. The sloping portions, e.g., 104b, are representative of a positive going voltage drift on the capacitor 60 (FIG. 2) occurring when the transistor 58 (FIG. 2) is off. The flat portions, e.g., 104a, are representative of the voltage 104 on the capacitor being forced to equal the input voltage 102 via the switch 76 (FIG. 2) as is further described below.

A curve 106 is representative of the voltage difference, Vc−Vi, between the voltage, Vc, appearing at the threshold node 60a of FIG. 2 (curve 104) and the input voltage 52, Vi, (curve 102) when the logic circuit 68 of FIG. 2 is operating in the above-described second mode of operation. It can be recognized that the voltage difference, Vc−Vi, is also a difference between the voltage on the two inputs 64a, 64b of the comparator 64 of FIG. 2. The curve 106 has flat portions, of which a portion 106a is but one example, and sloping portions, of which a portion 106b is but one example. The sloping portions, e.g., 106b, are representative of the positive going voltage drift on the capacitor 60. The flat portions, e.g., 106a, are representative of the voltage 104 on the capacitor 60 being forced to equal the input voltage 102 via the switch 76.

Two thresholds 108a, 108b correspond to the upper and lower thresholds, respectively, of the comparator 64 (FIG. 2). The thresholds 108a, 108b have levels according to a predetermined hysteresis associated with the comparator 64. It should be appreciated that the voltage difference, Vc−Vi, corresponding to the curve 106, does not reach a voltage of the threshold 108a when the logic circuit 68 is operating in the above-described second mode of operation.

A curve 110 is representative of the output voltage 66 appearing at the comparator output node 64c (FIG. 2). Because the curve 106 does not reach a voltage corresponding to the threshold 108a, the comparator 64 (FIG. 2) does not change state, and the curve 110 remains at an unchanged state, here shown to be a low state.

A curve 112 shows the PDR signal (FIG. 2) having the PDR pulses, of which pulse 112a is but one example, appearing at the logic circuit output 68b of FIG. 2 when the logic circuit 68 is operating in the above-described second mode of operation. Each of the PDR pulses aligns in time and result in a respective flat portion of the curves 104, 106. Each PDR pulse forces the voltage at the threshold node 60a to equal the input voltage 52 while the PDR pulse is high, for example, by way of the switch 76 of FIG. 2.

Voltage on the capacitor 60 having voltage drift corresponding to the sloping portions of the curves 104 and 106 would tend to cross the threshold 108a, resulting in a change of state of the comparator 64 (self-switching). However, it should be recognized that the PDR pulses keep the positive voltage drift associated with the curves 104, 106 from crossing the comparator threshold 108a, and therefore, the PDR pulses keep the comparator 66 from self-switching in the presence of the voltage drift.

It should be still further recognized that similar advantages would be achieved if the output voltage 66 of the comparator 64 represented by the curve 110 were in a positive state instead of a zero state.

While a DC input voltage 52 corresponding to the curve 102 is shown, it will be appreciated that the same concepts apply to a slowly varying input voltage 52.

Figure 4:
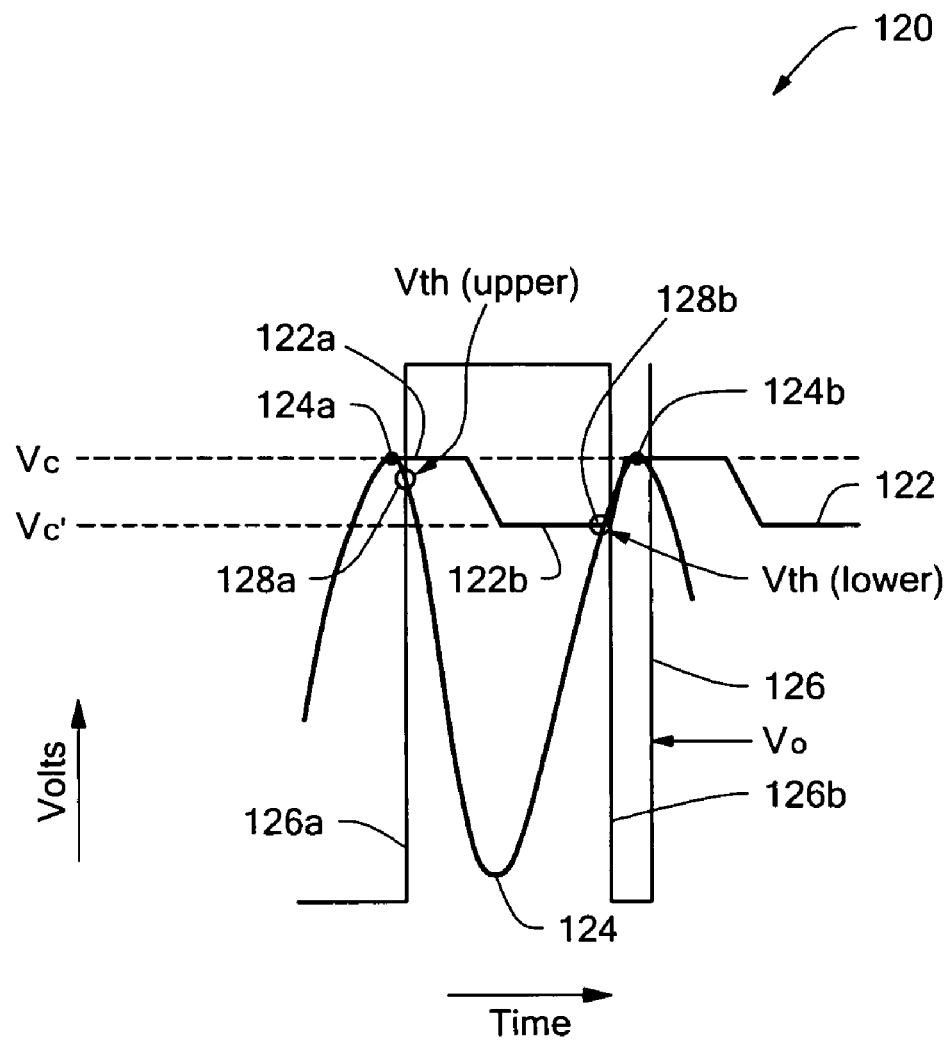
FIG. 4 is a graph showing further details of the operation of the circuit of FIG. 2.

Referring now to FIG. 4, a graph 120 shows operation of the circuit 50 of FIG. 2 resulting from the delay module 78, the pulse generator 80, the switch 82, and the current source 84 of FIG. 2. The graph 120 has a horizontal scale in units of time and a vertical scale in units of voltage. A curve 124 having peaks 124a, 124b corresponds to the input signal 52 of FIG. 2. A curve 122 corresponds to the voltage on the capacitor 60 (FIG. 2), i.e., at the threshold node 60a (FIG. 2). A curve 126 corresponds to the output signal 66 (FIG. 2) appearing at the output node 64c (FIG. 2) of the comparator 64 (FIG. 2). First and second levels, Vc and Vc', respectively, correspond to two levels of voltage on the capacitor 60. The first voltage level, Vc, corresponds to the peak value of the input signal 124 held on the capacitor 60. The second voltage level, Vc', corresponds to the peak value of the input signal 124 held on the capacitor 60 but reduced by a predetermined amount by way of the delay 78, the pulse generator 80, the switch 82, and the current source 84 of FIG. 2. It can be seen that the second voltage level, Vc', is achieved at some time after the peaks 124a, 124b of the input signal 124 in accordance with the delay module.

In the graph 120, the input signal 124 is varying, and therefore, the PDR pulses 112 of FIG. 3 are not generated by the logic circuit 68 (FIG. 2) and the logic circuit 68 (FIG. 2) is operating in the above-described first mode of operation.

In operation, a rising edge 126a of the curve 126 is indicative of detection of a first peak 124a of the input signal 124. Essentially, a voltage difference, Vc–Vi, between a voltage, Vc, on the capacitor 60 (curve 122) and a voltage, Vi, of the input signal 52 (curve 124) exceeds an upper comparator threshold (e.g., threshold 108a of FIG. 3) at a point 128a, resulting in a change of state of the comparator 64, i.e., the edge 126a. If the voltage on the capacitor 60 were to remain at the level, Vc, then the comparator output signal 126 would remain high and the second peak 124b of the input signal 124 would not result in another transition of the comparator output signal 126, i.e., the second peak 124b would not be detected. However, because the capacitor voltage corresponding to the curve 122 is forced to the lower voltage, Vc' by operation of the delay 78, the pulse generator 80, the switch 82, and the current source 84, then at a point 128b, the voltage difference, Vc–Vi, between the voltage, Vc', on the capacitor 60 (curve 122) and the input voltage, Vi, (curve 124) exceeds a low comparator threshold (e.g., threshold 108b of FIG. 3), resulting in a change of state of the comparator 64, i.e., the edge 126b. Thereafter the peak 124b can be detected as described above in essentially the same way that the peak 124a is detected.

Figure 5:
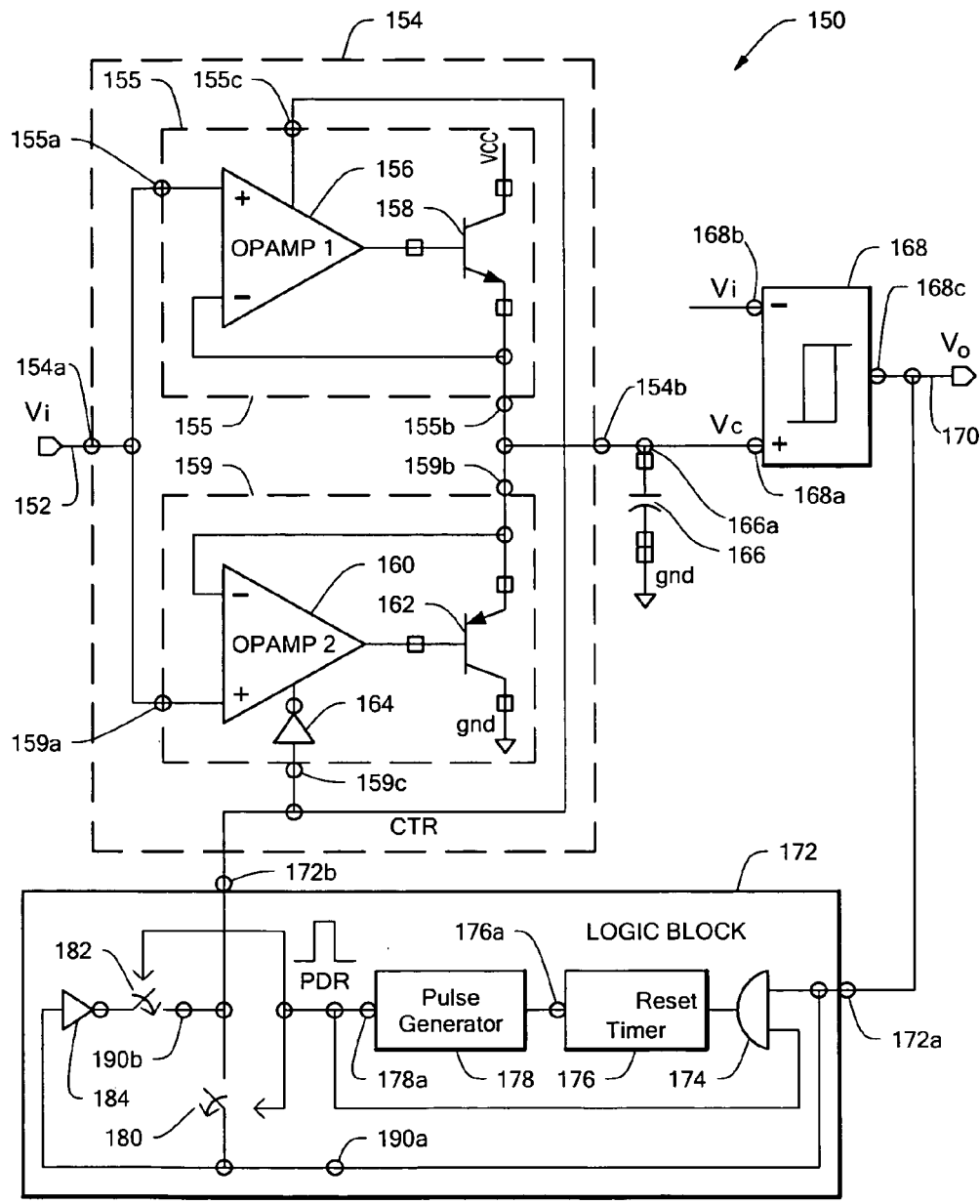
FIG. 5 is a block diagram of a circuit able to detect positive and negative peaks of an input signal in accordance with a further embodiment of the invention.

Referring now to FIG. 5, a circuit 150 includes a capacitor 166 having a threshold node 166a. The circuit 150 also includes a charging/discharging circuit 154 having a charging circuit 155 and a discharging circuit 159. The charging circuit 155 has a charging circuit input node 155a to receive an input signal 152, a charging circuit output node 155b coupled to the threshold node 166a, and an enable node 155c. The discharging circuit 159 has a discharging circuit input node 159a to receive the input signal 152, a discharging circuit output node 159b coupled to the threshold node 166a, and an inverted enable input node 159c.

The circuit 150 also includes a comparator 168 having a first comparator input node 168a coupled to the threshold node 166a, a second comparator input node 168b coupled to the charging circuit input node 155a and to the discharging circuit input node 159a, and a comparator output node 168c at which a comparator output signal 170 is provided. The comparator 168 provides the comparator output signal 170 at the comparator output node 168c in response to a voltage difference, Vc–Vi, between a voltage, Vc, at the threshold node 166a and a voltage, Vi, of the input signal 152. The comparator 168 can be arranged having two thresholds to provide hysteresis, an upper threshold and a lower threshold.

The circuit 150 still further includes a logic circuit 172 having a logic circuit input node 172a coupled to the comparator output node 168c and a logic circuit output node 172b coupled to the enable input node 155c and to the inverted enable input node 159c. In some embodiments, the logic circuit 172 includes a gate 174, a timer 176, a pulse generator 178, a first switch 180, a second switch 182, and an inverter 184. A selected one of a first logic circuit output signal 190a and a second logic circuit output signal 190b is provided at the logic circuit output node 172b in response to a predetermined period of time during which the comparator output signal 170 has no output signal transitions.

In some embodiments, the charging circuit 155, and the discharging circuit 159 include an amplifier 156, 160, respectively, and a transistor 158, 162, respectively. In some further embodiments, at least the capacitor 166, the charging/discharging circuit 154, the comparator 168, and the logic circuit 172 are provided on a common substrate (not shown).

In operation, the charging circuit 155 and the discharging circuit 159 are enabled and disabled, respectively, or disabled and enabled, respectively, in accordance with a state of a control signal, CTR, applied to the enable input 155c and to the inverted enable input 159c. When enabled, the charging circuit 155 provides a charging signal at the charging circuit output node 155b to charge the capacitor 166 to a voltage in accordance with a positive peak of the input signal 152. When enabled, the discharging circuit 159 provides a discharging signal at the second discharging circuit output node 159b to discharge the capacitor 166 to a voltage in accordance with a negative peak of the input signal 152.

When the charging circuit 155 is enabled, which can only charge the capacitor 166, reaching the positive peak voltage of the input signal 152 results in the capacitor 166 holding the positive peak voltage of the input signal 152 at the threshold node 166a. When the input signal 152 thereafter begins to transition to a lower voltage, causing the voltage difference, Vc–Vi, to increase and cross a threshold of the comparator 168, a change in state occurs at the comparator output node 168c.

More specifically, once enabled, the charging circuit 155 tends to force a voltage on the capacitor 166 that follows the voltage of the input signal 152 as it moves upward, causing both comparator inputs 168a, 168b to become substantially equal, i.e., Vc–Vi is substantially equal to zero. Having substantially equal voltages, the voltage difference, Vc–Vi, remains between the two thresholds of the comparator 166 while the input signal 152 moves upward in voltage, and the output signal 170 of the comparator 168 remains in the low state. Operation of the charging circuit 155 will be further understood from the discussion of FIG. 6 below.

When the discharging circuit 159 is enabled, which can only discharge the capacitor 166, reaching the negative peak voltage of the input signal 152 results in the capacitor 166 holding the negative peak voltage of the input signal 152 at the threshold node 166a. When the input signal 152 thereafter begins to transition to a higher voltage, causing the voltage difference, Vc–Vi, to decrease and cross a threshold of the comparator 168, another change in state occurs at the comparator output node 168c.

More specifically, once enabled, the discharging circuit 159 tends to force a voltage on the capacitor 166 that follows the voltage of the input signal 152 as it moves downward away from the positive peak of the input signal 152, causing both comparator inputs 168a, 168b to become substantially equal, i.e., Vc–Vi is substantially equal to zero. Having the substantially equal input voltages, the voltage difference, Vc–Vi, remains between the two thresholds of the comparator 168 while the input signal 152 moves downward in voltage, and the output signal 170 of the comparator 168 remains in the high state. Operation of the discharging circuit 159 is further described below in conjunction with FIG. 6.

In a first mode of operation of the logic circuit 172, achieved when the input signal 152 is varying in voltage, the logic circuit 172 generates a steady state (DC) PDR signal at the logic circuit output node 172b. In the first mode of operation, the timer 176 is repeatedly reset by changes in state of the comparator output signal 170 caused by the varying input signal 152. In this mode of operation, the pulse generator 178 remains in a low state resulting in the first switch 180 being closed and the second switch 182 being open. Therefore, the output signal 170 of the comparator 168 is directed to the logic circuit output node 172b, and the comparator output signal 170 becomes the control signal, CTR. When the CTR signal is low (i.e., the comparator output signal 170 is low), the charging circuit 155 is enabled and the discharging circuit 159 is disabled. Conversely, when the CTR signal is high (i.e., the comparator output signal 170 is high), the charging circuit 155 is disabled and the discharging circuit 159 is enabled.

In a second mode of operation of the logic circuit 172, achieved when the input signal 152 is slowly varying or DC, the output of the comparator 168 either has transitions widely spaced in time or no transition, respectively, resulting in either widely spaced resets or no resets applied to the timer 176. Taking, for example, a DC input signal 152, which results in no resets applied to the timer 176, the timer 176 counts up to a terminal count in a predetermined amount of time, at which time an output 176a of the timer 176 provides a transition, causing the pulse generator 178 (e.g., monostable multivibrator) to output a high state PDR signal (i.e., a PDR pulse) at a pulse generator output node 178a.

While the PDR signal is high, the first switch 180 is open and the second switch 182 is closed resulting in the inverse of the comparator output signal 170 being directed to the logic circuit output node 172b, and the inverse of the comparator output signal 170, via the inverter 184, becomes the control signal, CTR. In this condition, the charging circuit 155 is enabled and the discharging circuit 159 is disabled when the CTR signal is low (i.e., the comparator output signal 170 is high) and the charging circuit 155 is disabled and the discharging circuit 159 is enabled when the CTR signal is high (i.e., the comparator output signal 170 is low).

While the PDR signal is low, the first switch 180 is closed and the second switch 182 is open resulting in the comparator output signal 170 being directed to the logic circuit output node to become the control signal, CTR. In this condition, the charging circuit 155 is enabled and the discharging circuit 159 is disabled when the CTR signal is low (i.e., the comparator output signal 170 is low) and the charging circuit 155 is disabled and the discharging circuit 159 is enabled when the CTR signal is high (i.e., the comparator output signal 170 is high).

It will become apparent from the discussion below in conjunction with FIGS. 6 and 7 that enabling the charging circuit 155 or the discharging circuit 159 can avoid self-switching of the comparator 168.

The PDR signal is also coupled to the gate 174, and when a PDR pulse appears on the PDR signal, the timer 176 is reset according to a state of the PDR signal. When the PDR pulse terminates, the timer 176 again counts, reaching its terminal count after the predetermined time and another PDR pulse is generated. With this arrangement, the logic circuit 172 continually generates PDR pulses so long as the input signal 152 remains unchanged or slowly varying.

In order to operate properly, the timer 176 must be adjusted so that the voltage difference Vc–Vi does not reach a threshold of the comparator 168. For example, in on particular embodiment, the capacitor 166 has a value of 100 pf and a net leakage current of 10 pa. The resulting voltage drift is about 0.1 mv/ms. For a comparator threshold of 100 mv, a timer count associated with the timer 176 should be selected to elapse before one second in order to avoid self-switching. With the selected timer elapsed time, in order to detect peaks of the input signal 152, the input signal 152 must have a rate of change higher than 100 mv/ls. For a 1 Vpp sinusoidal input signal 152, this corresponds to minimum input signal operating frequency of 0.32 Hz.

Figure 6:
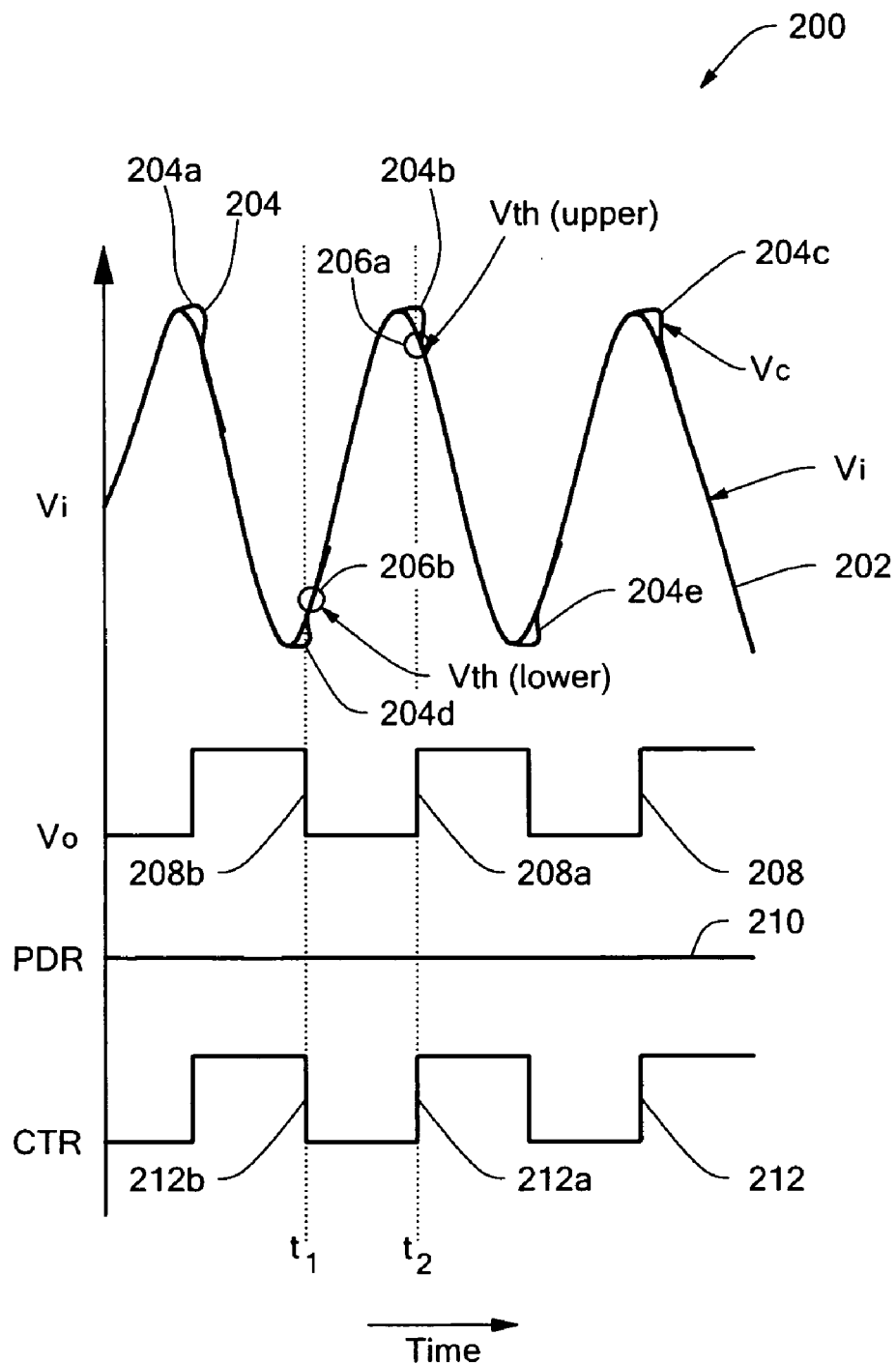
FIG. 6 is a graph showing details of the operation of the circuit of FIG. 5.

Referring now to FIG. 6, a graph 200 has a horizontal scale in units of time and a vertical scale in units of voltage. A first curve 202 corresponds to the input signal 152 of FIG. 5. A curve 204 has portions 204a-204c corresponding first to a voltage held on the capacitor 166 in accordance with a positive peak of the input signal 202 and thereafter to a voltage on the holding capacitor 166 being forced to equal the voltage of the input signal 202 by operation of the discharging circuit 159 (FIG. 5). Curve portions 204d-204e correspond first to a voltage held on the capacitor 166 in accordance with a negative peak of the input signal 202 and thereafter to a voltage on the holding capacitor being forced to equal the voltage of the input signal 202 by operation of the charging circuit 155 (FIG. 5).

A point 206a corresponds to a time, t2, at which the voltage difference, Vc–Vi, between the capacitor voltage 204b and the input signal 202 exceeds an upper threshold, Vth (upper), of the comparator 168 (FIG. 5). A point 206b corresponds to a time, t1, at which the voltage difference, Vc–Vi, between the capacitor voltage 204d and the input signal 202 goes below a lower threshold, Vth (lower), of the comparator 168.

A curve 208 corresponds to the output signal 170 (FIG. 5) generated by the comparator 168. A rising edge 208a at the time, t2, aligns with the point 206a and a falling edge 208b at the time, t1, aligns with the point 206b.

A curve 210 corresponds to a voltage appearing at the pulse generator output node 178a (FIG. 5) indicating that the PDR pulses are not present (i.e., the logic circuit 172 (FIG. 5) is operating in the first mode of operation).

A curve 212 corresponds to the control signal. CTR, appearing at the logic circuit output node 172b (FIG. 5), each state change of which forces the capacitor voltage 204a-204e to equal the input signal 202 by enabling an appropriate one of the charging circuit 155 and the discharging circuit 159 as described above in conjunction with FIG. 5.

Figure 7:
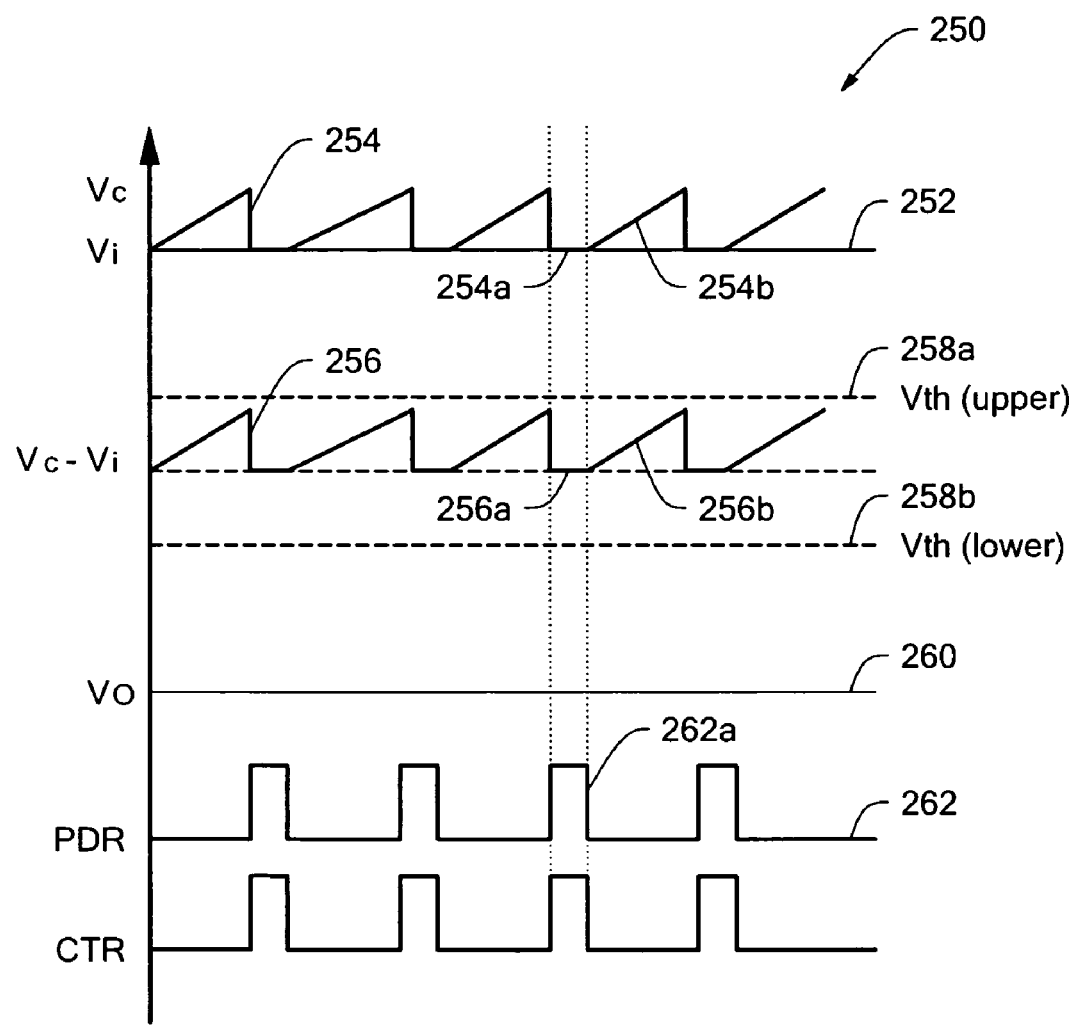
FIG. 7 is a graph showing further details of the operation of the circuit of FIG. 5.

Referring now to FIG. 7, a graph 250 has a horizontal scale in units of time and a vertical scale in units of voltage. A curve 252 is indicative of a DC input voltage 152 (FIG. 5). A curve 254 is representative of a voltage appearing on the capacitor 166 of FIG. 5, which is the same as a voltage appearing at the threshold node 166a of FIG. 5 when the logic circuit 172 of FIG. 5 is operating in the above-described second mode of operation. The curve 254 has flat portions, of which a flat portion 254a is but one example, and sloping portions, of which a sloping portion 254b is but one example. The sloping portions, e.g., 254b, are representative of a positive going voltage drift on the capacitor 166 (FIG. 5). The flat portions, e.g., 254a, are representative of the voltage 254 on the capacitor being forced to equal the input voltage 252 as is further described below.

A curve 256 is representative of a voltage difference, Vc–Vi, between the voltage, Vc, appearing at the threshold node 166a of FIG. 5 (curve 254) and the input voltage, Vi, 152 (curve 252). It can be recognized that the voltage difference, Vc–Vi, is also a difference between the voltage on the two input nodes 168a, 168b of the comparator 168 of FIG. 5. The curve 256 has flat portions, of which a flat portion 256a is but one example, and sloping portions, of which a sloping portion 256b is but one example. The sloping portions, e.g., 256b, are representative of the positive going voltage drift on the capacitor 166. The flat portions, e.g., 256a, are representative of the voltage 254 on the capacitor 166 being forced to equal the input voltage 252.

Two thresholds 258a, 258b correspond to upper and lower thresholds, respectively, of the comparator 168 (FIG. 5). The thresholds 258a, 258b have levels according to a predetermined hysteresis associated with the comparator 168. It should be appreciated that the voltage difference, Vc–Vi, corresponding to the curve 256, does not reach a voltage of either of the thresholds 258a, 258b when the logic circuit 172 is operating in the above-described second mode of operation.

A curve 260 is representative of the output signal 170 appearing at the comparator output node 168c of FIG. 5. Because the curve 256 does not reach a voltage corresponding to the thresholds 258a, 258b, the comparator 168 (FIG. 5) does not change state, and the curve 260 remains at an unchanged state, here shown to be a low state.

A curve 262 shows the PDR signal (FIG. 5) having the PDR pulses, of which pulse 262a is but one example, appearing at the pulse generator output 178a of FIG. 5. Each of the PDR pulses aligns in time and result in a respective flat portion of the curves 254, 256. Each PDR pulse forces the capacitor voltage 254 to equal the input voltage 252 while the pulse is high, for example, by way of the charging/discharging circuit 154 of FIG. 5.

Voltage on the capacitor 166 having voltage drift corresponding to the sloping portions of the curves 254 and 256 would tend to cross the threshold 258a, resulting in a change of state of the comparator 168 (self-switching). However, it should be recognized that the PDR pulses keep the positive voltage drift associated with the curves 254, 256 from crossing the comparator thresholds 258a, 258b, and therefore, the PDR pulses keep the comparator 168 from self-switching in the presence of the voltage drift.

It should be further recognized that similar advantages would be achieved if the voltage drift were negative going, i.e., if the curve 256 were to have ramps with a negative slope instead of the positive slope. It should be still further recognized that similar advantages would be achieved if the output voltage 170 of the comparator 168 shown by the curve 260 were in a positive state instead of a zero state.

While a DC input voltage 152 corresponding to the curve 252 is shown, it will be appreciated that the same concepts apply to a slowly varying input voltage 152.

Figure 8:
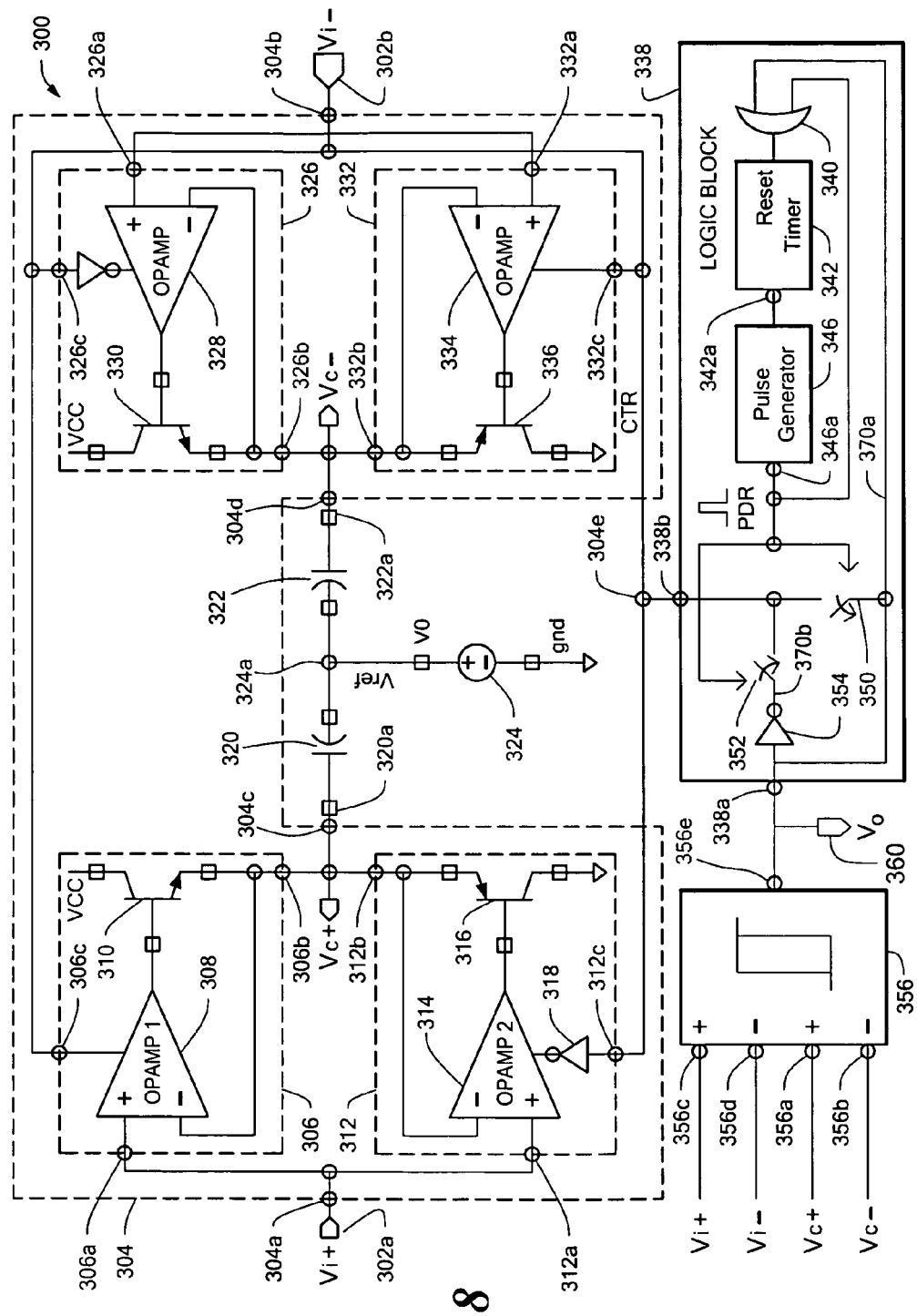
FIG. 8 is a block diagram of a differential circuit able to detect positive and negative peaks of an input signal in accordance with a further embodiment of the invention.

Referring now to FIG. 8, a circuit 300 includes a first capacitor 320 having a first threshold node 320a and a second capacitor 322 having a second threshold node 322a. The circuit 300 further includes a charging/discharging circuit 304 having at least two charging/discharging circuit input nodes 304a, 304b to receive an input signal 302a and an inverted input signal 302b, at least two charging/discharging circuit output nodes 304c, 304d coupled respectively to the first threshold node 320a and to the second threshold node 322a, and an enable/disable node 304e. It will be understood that the charging/discharging circuit 304, the first and second capacitors 320, 322, respectively, and a voltage source 324 form a track-and-hold circuit, and therefore, the charging/discharging circuit output nodes 304c, 304d are also referred to herein as track-and-hold circuit output nodes. The circuit further includes a comparator 356 having first differential comparator input nodes 356a, 356b coupled to the first and second threshold nodes 320a, 322a, respectively, second differential comparator input nodes 356c, 356d coupled to respective ones of the at least two charging/discharging circuit input nodes 304a, 304b, and a comparator output node 356e at which a comparator output signal 360 is provided. The circuit 300 still further includes a logic circuit 338 having a logic circuit input node 338a coupled to the comparator output node 356e and a logic circuit output node 338b coupled to the enable/disable node 304e. In some embodiments, the logic circuit 338 includes a gate 340, a timer 342, a pulse generator 346, a first switch 350, a second switch 352, and an inverter 354. A selected one of a first logic circuit output signal 370a and a second logic circuit output signal 370b is provided at the logic circuit output node 338b in response to a predetermined period of time during which the comparator output signal 360 has no output signal transitions.

In some embodiments, the charging/discharging circuit 304 includes a first charging circuit 306 having a first charging circuit input node 306a to receive the input signal 302a, a first charging circuit output node 306b coupled to the first threshold node 320a, and a first charging circuit enable input node 306c coupled to the logic circuit output node 338b. The charging/discharging circuit 304 further includes a first discharging circuit 312 having a first discharging circuit input node 312a to receive the input signal 302a, a first discharging circuit output node 312b coupled to the first threshold node 320a, and a first discharging circuit inverted enable input node 312c coupled to the logic circuit output node 338b. The charging/discharging circuit 304 still further includes a second charging circuit 326 having a second charging circuit input node 326a to receive the inverted input signal 302b, a second charging circuit output node 326b coupled to the second threshold node 322a, and a second charging circuit inverted enable input node 326c coupled to the logic circuit output node 338b. The charging/discharging circuit 304 still further includes a second discharging circuit 332 having a second discharging circuit input node 332a to receive the inverted input signal 302b, a second discharging circuit output node 332b coupled to the second threshold node 322a, and a second discharging circuit enable input node 332c coupled to the logic circuit output node 338b.

In some embodiments, the first charging circuit 306, the first discharging circuit 312, the second charging circuit 326, and the second discharging circuit 332 include an amplifier 308, 314, 328, 334, respectively, and a transistor 310, 316, 330, 336, respectively. In some further embodiments, the first capacitor 320, the second capacitor 322, the charging/discharging circuit 304, the comparator 356, and the logic circuit 338 are provided on a common substrate (not shown).

In operation, the first charging circuit 306 and the second discharging circuit 332 are enabled or disabled together and the second charging circuit 312 and the first discharging circuit 326 are enabled or disabled together in accordance with a state of a control signal, CTR, applied to the enable inputs 306c, 332c and to the inverted enable inputs 312c, 326c. The charging/discharging circuit 304 provides charging/discharging signals at the at least two charging/discharging circuit output nodes 304c, 304d to charge the first capacitor 320 to a voltage in accordance with a positive peak of the input signal 302a and to discharge the second capacitor 322 to a voltage in accordance with a negative peak of the inverted input signal 302b. The charging/discharging circuit 304 provides charging/discharging signals at the at least two charging/discharging circuit output nodes 304c, 304d to discharge the first capacitor 320 to a voltage in accordance with a negative peak of the input signal 302a and to charge the second capacitor 322 to a voltage in accordance with a positive peak of the inverted input signal 302b. The comparator is responsive to a voltage difference ((Vc+)−Vc−)−((Vi+)−Vi−).

When the first charging circuit 306 is enabled, which can only charge the capacitor 320, reaching the positive peak voltage of the input signal 302a results in the capacitor 320 holding the positive peak voltage of the input signal 302 at the first threshold node 320a. When the second discharging circuit 332 is enabled (at the same time that the first charging circuit 306 is enabled), which can only discharge the capacitor 322, reaching the negative peak voltage of the inverted input signal 302b results in the capacitor 322 holding the negative peak voltage of the inverted input signal 302b at the second threshold node 322a. When the input signal 302a thereafter begins to transition to a lower voltage and the inverted input signal 302b thereafter begins to transition to a higher voltage, causing the voltage difference, ((Vc+)−Vc−)−((Vi+)−Vi−), to increase and cross an upper threshold of the comparator 356, a change in state occurs at the comparator output node 356e.

More specifically, once enabled, the first charging circuit 306 tends to force a voltage on the first capacitor 320 that follows the voltage of the input signal 302a as it moves upward, and the second discharging circuit 332 tends to force a voltage on the second capacitor 322 that follows the voltage of the inverted input signal 302b as it moves downward, causing the comparator inputs 356a, 356c to become substantially equal and the comparator inputs 356b, 356d to become substantially equal, i.e., (Vc+)−Vi+ and (Vc−)−Vi− are both substantially equal to zero. Therefore, while the input signal 302a increases in voltage and the inverted input signal 302b decreases in voltage, the voltage difference, ((Vc+)−Vc−)−((Vi+)−Vi−), remains between the two thresholds of the comparator 356 and the comparator 356 remains in the low state.

When the second charging circuit 326 is enabled, which can only charge the capacitor 322, reaching the positive peak voltage of the inverted input signal 302b results in the capacitor 322 holding the positive peak voltage of the inverted input signal 302b at the second threshold node 322a. When the first discharging circuit 312 is enabled (at the same time that the second charging circuit 326 is enabled), which can only discharge the capacitor 320, reaching the negative peak voltage of the input signal 302a results in the capacitor 320 holding the negative peak voltage of the input signal 302a at the first threshold node 320a. When the inverted input signal 302b thereafter begins to transition to a lower voltage and the input signal 302a thereafter begins to transition to a higher voltage, causing the voltage difference, ((Vc+)−Vc−)−((Vi+)−Vi−), to decrease and cross the lower threshold of the comparator 356, a change in state occurs at the comparator output node 356e.

More specifically, once enabled, the second charging circuit 326 tends to force a voltage on the second capacitor 322 that follows the voltage of the inverted input signal 302b as it moves upward, and the first discharging circuit 312 tends to force a voltage on the second capacitor 322 that follows the voltage of the input signal 302a as it moves downward, causing the comparator inputs 356a, 356c to become substantially equal and the comparator inputs 356b, 356d to become substantially equal, i.e., (Vc+)−Vi+ and (Vc−)−Vi− are both substantially equal to zero. Therefore, while the input signal 302a decreases in voltage and the inverted input signal 302b increases in voltage, the voltage difference, ((Vc+)−Vc−)−((Vi+)−Vi−), remains between the two thresholds of the comparator 356 and the comparator 356 remains in the high state. Operation of the circuit 300 will be further understood from the discussion of FIG. 6 above, where Vc is replaced by (Vc+)−Vc− and Vi is replaced by (Vi+)−Vi−.

In a first mode of operation of the logic circuit 338, achieved when the input signal and inverted input signal 302a, 302b, respectively, are varying in voltage, the logic circuit 338 generates a steady state (DC) PDR signal at the pulse generator output node 346a. In the first mode of operation, the timer 342 is repeatedly reset by changes in state of the comparator output signal 360 caused by the varying input signal and inverted input signal 302a, 302b. In this mode of operation, the pulse generator 346 remains in a low state resulting in the first switch 350 being open and the second switch 352 being closed. Therefore, the output signal 360 of the comparator 356 is directed to the logic circuit output node 338b, and the comparator output signal 360 becomes the control signal, CTR. When the CTR signal is low (i.e., the comparator output signal 360 is low), the first charging circuit 306 and the second discharging circuit 332 are enabled and the second charging circuit 326 and the first discharging circuit 312 are disabled. Conversely, when the CTR signal is high (i.e., the comparator output signal 360 is high), the first charging circuit 306 and the second discharging circuit 332 are disabled and the second charging circuit 326 and the first discharging circuit 312 are enabled.

In a second mode of operation of the logic circuit 338, achieved when the input signal and the inverted input signal 302a, 302b are slowly varying or DC, the output of the comparator 356 either has transitions widely spaced in time or no transition, respectively, resulting in either widely spaced resets or no resets applied to the timer 342. Taking, for example, a DC input signal 302a and a corresponding DC inverted input signal 302b, which results in no resets applied to the timer 342, the timer 342 counts up to a terminal count in a predetermined amount of time, at which time an output 342a of the timer 342 provides a transition, causing the pulse generator 346 (e.g., monostable multivibrator) to output a high state PDR signal (i.e., a PDR pulse) at a pulse generator output node 346a.

While the PDR signal is high, the first switch 350 is open and the second switch 352 is closed resulting in the inverse of the comparator output signal 360 being directed to the logic circuit output node 338b and the inverse of the comparator output signal 360, via the inverter 354, becomes the control signal, CTR. In this condition, the first charging circuit 306 and the second discharging circuit 332 are enabled and the second charging circuit 326 and the first discharging circuit 312 are disabled when the CTR signal is low (i.e., the comparator output signal 360 is high). Also, the first charging circuit 306 and the second discharging circuit 332 are disabled and the second charging circuit 326 and the first discharging circuit 312 are enabled when the CTR signal is high (i.e., the comparator output signal 360 is low).

While the PDR signal is low, the first switch 350 is closed and the second switch 352 is open resulting in the comparator output signal 360 being directed to the logic circuit output node 338b to become the control signal, CTR. In this condition, the first charging circuit 306 and the second discharging circuit 332 are enabled and the second charging circuit 326 and the first discharging circuit 312 are disabled when the CTR signal is low (i.e., the comparator output signal 360 is low). Also, the first charging circuit 306 and the second discharging circuit 332 are disabled and the second charging circuit 326 and the first discharging circuit 312 are enabled when the CTR signal is high (i.e., the comparator output signal 360 is high).

The PDR signal is also coupled to the gate 340, and when a PDR pulse appears on the PDR signal, the timer 342 is reset according to a state of the PDR signal. When the PDR pulse terminates, the timer 342 again counts, reaching its terminal count after the predetermined time and another PDR pulse is generated. With this arrangement, the logic circuit 338 continually generates PDR pulses so long as the input signal 302a and the inverted input signal 302b remain unchanged or slowly varying.

Operation of the circuit 300 is very similar to operation of the circuit 150 of FIG. 5, but operating in a differential mode. Operation can be understood from the graphs 200, 250 of FIGS. 6 and 7, respectively, but with Vi replaced by (Vi+)−

Vi−, Vc replaced by (Vc+)−Vc−, and Vc−Vi replaced by ((Vc+)−Vc−)−((Vi+)−Vi−). Therefore, operation of the circuit 300 is not further described herein.

Figure 9:
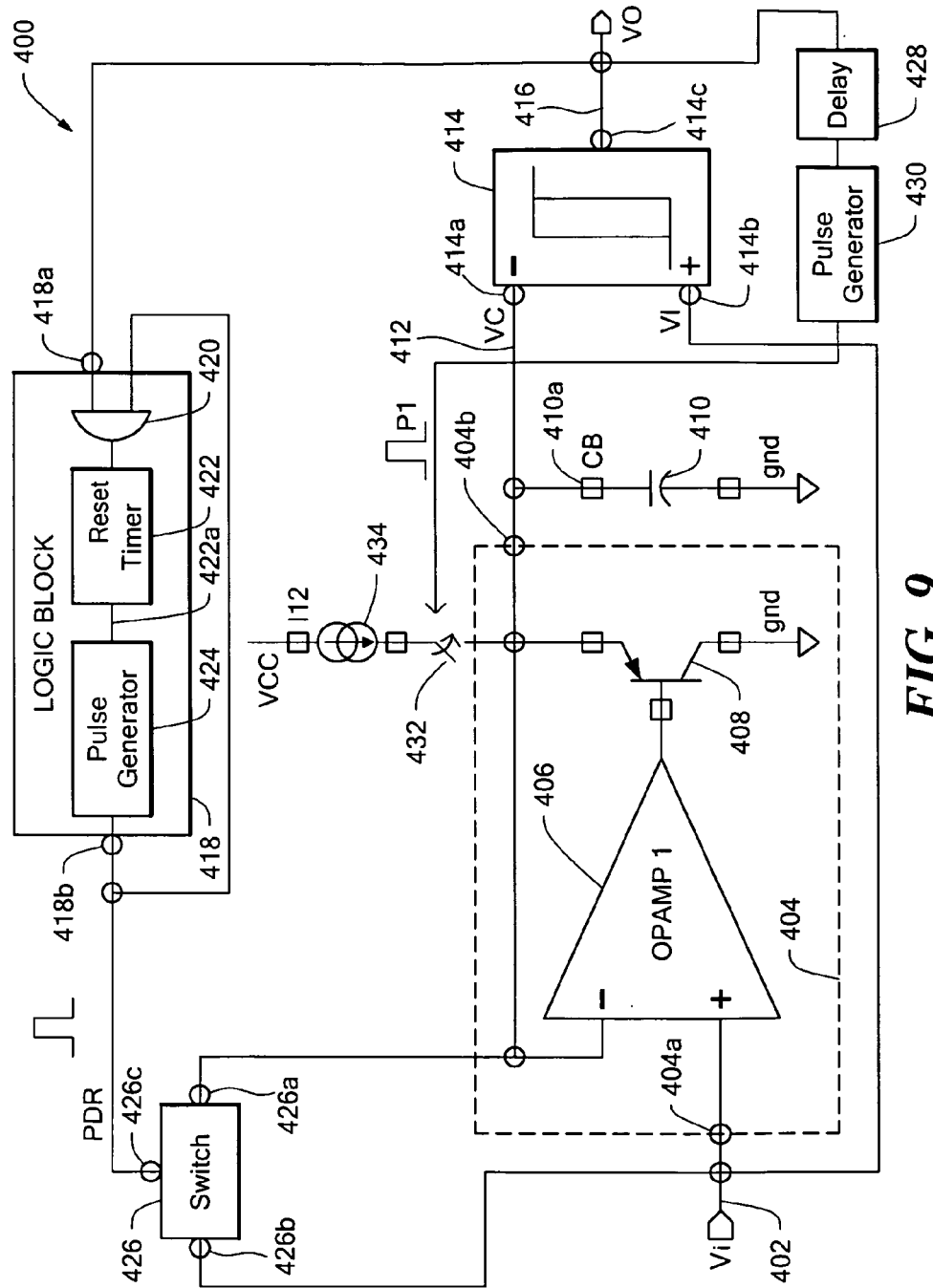
FIG. 9 is a block diagram of a circuit able to detect negative peaks of an input signal in accordance with the present invention.

Referring now to FIG. 9, a circuit 400 includes a capacitor 410 having a threshold node 410a. The circuit 400 also includes a discharging circuit 404 having a discharging circuit input node 404a to receive an input signal 402 and a discharging circuit output node 404b coupled to the threshold node 410a.

The circuit 400 also includes a comparator 414 having a first comparator input node 414a coupled to the threshold node 410a, a second comparator input node 414b coupled to the discharging circuit input node 404a, and a comparator output node 414c at which a comparator output signal 416 is provided. The comparator 414 provides the comparator output signal 416 at the comparator output node 414c in response to a voltage difference, Vi−Vc, between a voltage, Vi, of the input signal 402, and a voltage, Vc, at the threshold node 410a. The comparator 414 can be arranged having two thresholds to provide hysteresis, an upper threshold and a lower threshold.

The circuit 400 still further includes a logic circuit 418 having a logic circuit input node 418a coupled to the comparator output node 414c and a logic circuit output node 418b at which a logic circuit output signal, PDR, is provided in response to a predetermined period of time during which the comparator output signal 416 has no transitions. The circuit 400 still further includes a switch 426 having a first switch node 426a coupled to the threshold node 410a, a second switch node 426b coupled to the discharging circuit input node 404a, and a switch control node 426c coupled to the logic circuit output node 418b. In some embodiments, the circuit 400 also includes a delay module 428, a pulse generator 430, a switch 432, and a current source 434.

In some embodiments, the discharging circuit 404 includes an amplifier 406 and a transistor 408. In some further embodiments, the logic circuit 418 includes a gate 420, a timer 422, and a pulse generator 424 (monostable multivibrator). Also, in some embodiments, at least the capacitor 410, the discharging circuit 404, the comparator 414, the logic circuit 418, and the switch 426 are provided on a common substrate.

In operation, the discharging circuit 404 provides a discharging signal at the discharging circuit output node 404b to discharge the capacitor 410 to a voltage in accordance with a negative peak of the input signal 402. The discharging circuit 404 can only discharge the capacitor 410. Therefore, upon reaching the negative peak voltage of the input signal 402, the capacitor 410 holds the negative peak voltage of the input signal 402 at the threshold node 410a. When the input signal 402 thereafter begins to transition to a higher voltage, causing the voltage difference, Vi−Vc, to increase and cross an upper threshold of the comparator 414, a change in state, for example, a change to a high state, occurs at the comparator output node 414c. Therefore, the change in state at the comparator output node 414c can be used to detect a first negative peak of the input signal 402.

The pulse generator 430 generates pulse, P1, shortly after each transition of the output signal 416 to a high state, at a time in accordance with the delay module 428. The pulse, P1, operates via the switch 432 and the current source 434 to move the voltage at the threshold node 410a slightly upward. The shift in voltage at the threshold node 410a results in the comparator output signal 416 taking on a low state (i.e., resetting the comparator 414) when the input signal 402 reaches the voltage at the threshold node 410a. The circuit 400, therefore, becomes ready to detect the next negative peak of the input signal 402.

In a first mode of operation of the logic circuit 418, achieved when the input signal 402 is varying in voltage, the logic circuit 418 generates a steady state (DC) PDR signal (e.g., a low state) at the logic circuit output node 418b. In the first mode of operation, the timer 422 is repeatedly reset by changes in state of the comparator output signal 416 caused by the varying input voltage 402, resulting in the continual low state at the logic circuit output node 418b. In this mode of operation, the switch 426 remains open and the circuit 400 operates as described above.

In a second mode of operation of the logic circuit 418, achieved when the input signal 402 is slowly varying or DC, the logic circuit 418 generates a PDR signal having high and low states (i.e., PDR pulses) at the output node 418b. In this mode of operation, the output of the comparator 414 either has transitions widely spaced in time or no transitions, respectively, resulting in either widely spaced resets to the timer 422 or no resets, respectively. Taking, for example, a DC input signal 402, which results in no resets applied to the timer 422, the timer 422 counts up to a terminal count in a predetermined amount of time, at which time an output 422a of the timer 422 makes a transition, causing the pulse generator 424 (e.g., monostable multivibrator) to output a high state PDR signal (a PDR pulse) at the logic circuit output node 418b.

The PDR signal is received by the switch 426 at the switch control node 426c. During a time when the PDR signal is in the high state, i.e., during the PDR pulse, the capacitor 410 is coupled to the input signal 402 by way of the switch 426, forcing the voltage on the capacitor 410 (which may otherwise be experiencing voltage drift) to substantially equal the voltage of the input signal 402, and therefore, forcing the voltage at the threshold node 410a, to take on the voltage of the input signal 402 (i.e., Vi−Vc=0). It will be recognized that this condition prevents switching of the comparator 414.

The PDR signal is also coupled to a gate 420 and forces the timer 422 to reset according to a state of the PDR signal. When the PDR pulse terminates (i.e., the state at the node 418b returns to its original state), the timer 422 again counts, again reaching its terminal count after the predetermined time and another PDR pulse is generated. With this arrangement, the logic circuit 418 continually generates PDR pulses so long as the input signal 402 remains generally unchanged. It will be recognized that PDR pulses can also be generated for an input signal 402 that is slowly varying.

In the second mode of operation of the logic circuit 418, during a time when the PDR signal is at a low state, i.e., between PDR pulses, the circuit 400 operates as described above in the first mode of operation of the logic circuit 418.

When in the above-described second mode of operation of the logic circuit 418, self-switching of the comparator 414 is reduced or eliminated so long as the voltage at the threshold node 410a is not allowed to deviate very far from the voltage of the input signal 402, which can be accomplished by generating PDR pulses sufficiently close together.

Operation of the circuit 400 is very similar to operation of the circuit 50 of FIG. 2, but responsive to negative peaks of the input signal rather than to positive peaks. Operation can be understood from the graphs 100, 120 of FIGS. 3 and 4, respectively, but where Vc−Vi is replaced by Vi−Vc. Therefore, operation of the circuit 400 is not further described herein.

It will be understood that in embodiments described above and below for which capacitors are provided on a common substrate with other circuit components (i.e., integrated capacitors), the integrated capacitors provide better immunity than external discrete capacitors against noise coupled from external noise sources. Furthermore, capacitors having a low capacitance value (e.g., one hundred picoFarads) can be used.

Figure 10:
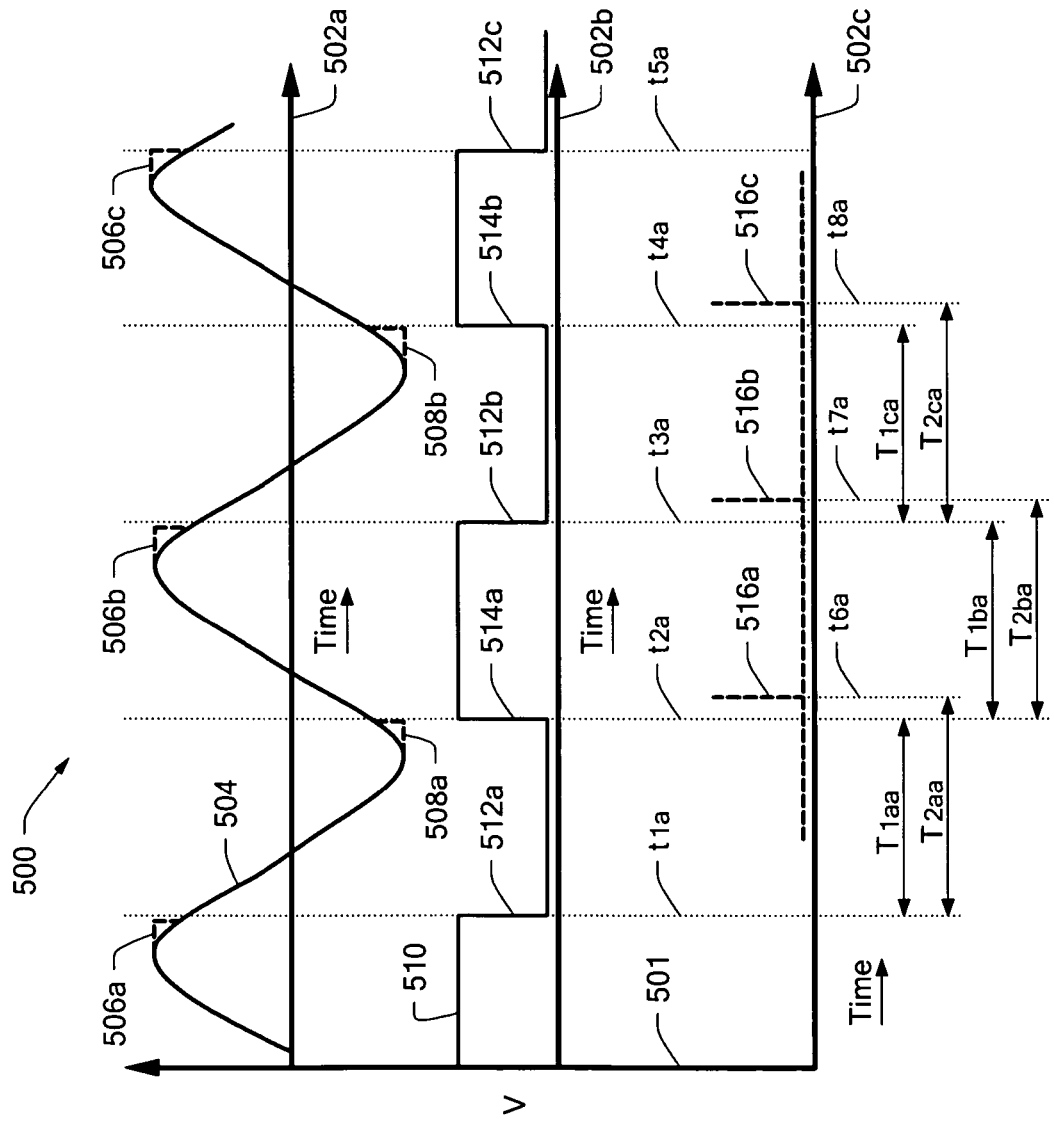
FIG. 10 is a graph showing further details of the operation of the circuits of FIGS. 2, 5, and 8.

Referring now to FIG. 10, a graph 500 has horizontal scales 502a-502c in units of time and a vertical scale 501 in units of volts. A slowly varying input signal 504 can correspond, for example, to the input signal 302a of FIG. 8 having a period sufficiently short to result in the circuit 300 of FIG. 8 being in the above-described first mode of operation. The input signal 504 can alternatively correspond to the input signal, Vi, of FIG. 2 or the input signal, Vi, of FIG. 5. However, the waveforms of FIG. 10 will be described in connection with the circuit of FIG. 8 for simplicity. In the first mode of operation, the PDR pulses are not generated at the pulse generator output node 346a of the logic circuit 338.

Held capacitor voltages 506a-506c can correspond, for example, to a voltage at the first threshold node 320a of FIG. 8 when the threshold node 320a holds a positive peak value of the input signal 504. Held capacitor voltages 508a-508b can correspond, for example, to a voltage at the first threshold node 320a of FIG. 8 when the threshold node 320a holds a negative peak value of the input signal 504. It should be understood that the capacitor voltage at other times, for example, at times between held capacitor voltages 506a and 508a, tracks the input signal 504.

An output signal 510 can correspond, for example, to the comparator output signal 360 of FIG. 8. The output signal 510 has falling edges 512a-512c at times t1a, t3a, and t5a. Each falling edge 512a-512c is indicative of a time when the held capacitor voltages 506a-506c deviate by a predetermined amount from the input signal 504. The output signal 510 has rising edges 514a-514b at times t2a and t4a. Each rising edge 514a-514b is indicative of a time when the held capacitor voltages 508a-508b deviate by a predetermined amount from the input signal 504. Therefore, the output signal 510 has edges indicative of the positive and negative peaks of the input signal 504 and a frequency indicative of a frequency of the input signal 504.

As described above, at each edge 512a-512c, 514a-514b of the output signal 510, the timer 342 (FIG. 8) is reset, starting a new count.

Periods T1aa-T1ca correspond to periods of respective half cycles of the output signal 510. Periods T2aa-T2ca correspond to times for the timer 342 to count to its terminal count, at which time a PDR pulse would be generated. The periods T1aa-T1ca are less than the periods T2aa-T2ca. Because the edges 512a-512c, 514a-514b of the output signal 510 are separated by the periods T1aa-T1ca, which are less than the periods T2aa-T2ca, the timer 342 does not reach its terminal count before it is reset by another edge of the output signal 510, and therefore, no PDR pulses are generated.

Pulses 516a-516c correspond, for example, to the PDR (or CDR) pulses of FIG. 8. The pulses 516a-516c are shown as phantom lines to indicate that the pulses do not occur but would occur at the times t6a, t7a, t8a were it not for the timer 342 being reset by edges of the output signal 510 at times t2a, t3a, and t4a, respectively.

Essentially, the input signal 504 has a frequency barely high enough to keep the circuit in the first mode of operation, in which the PDR pulses 516a-516c do no occur.

Figure 11:
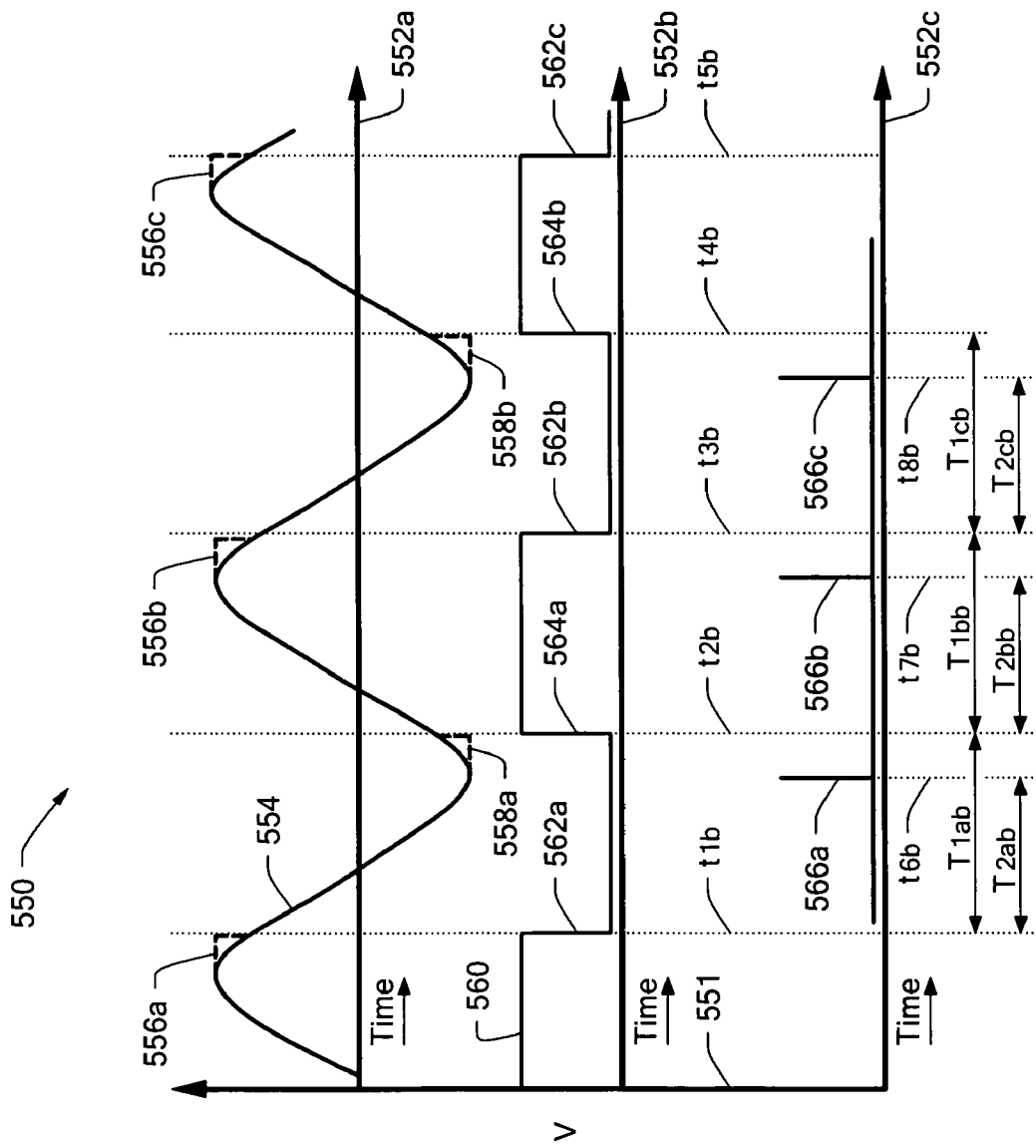
FIG. 11 is a graph showing still further details of the operation of the circuits of FIGS. 2, 5, and 8.

Referring now to FIG. 11, a graph 550 has horizontal scales 552a-552c in units of time and a vertical scale 551 in units of volts. A slowly varying input signal 554 can correspond, for example, to the input signal 302a of FIG. 8 having a period sufficiently long to result in the circuit 300 of FIG. 8 being in the above-described second mode of operation. In the second mode of operation, the PDR pulses are generated at the logic circuit output node 338b of the logic circuit 338.

Held capacitor voltages 556a-556c can correspond, for example, to a voltage at the first threshold node 320a of FIG. 8 when the threshold node 320a holds a positive peak value of the input signal 554. Held capacitor voltages 558a-558b can correspond, for example, to a voltage at the first threshold node 320a of FIG. 8 when the threshold node 320a holds a negative peak value of the input signal 504. It should be understood that the capacitor voltage at other times, for example, at times between the held capacitor voltages 556a and 558a, tracks the input signal 554.

An output signal 560 can correspond, for example, to the comparator output signal 360 of FIG. 8. The output signal 560 has falling edges 562a-562c at times t1b, t3b, and t5b, respectively. Each falling edge 562a-562c is indicative of a time when the held capacitor voltages 556a-556c deviate by a predetermined amount from the input signal 554. The output signal 560 has rising edges 564a-564b at times t2b and t4b. Each rising edge 564a-564b is indicative of a time when the held capacitor voltages 558a-558b deviate by a predetermined amount from the input signal 554. Therefore, the output signal 560 has edges indicative of the positive and negative peaks of the input signal 554 and a frequency indicative of a frequency of the input signal 554.

As described above, at each edge 562a-562c, 564a-564b of the output signal 560, the timer 342 (FIG. 8) is reset, starting a new count. Periods T1ab-T1cb correspond to periods of respective half cycles of the output signal 560. Periods T2ab-T2cb correspond to times for the timer 342 to count to its terminal count, at which time a PDR pulse would be generated. The periods T1ab-T1cb are greater than the periods T2ab-T2cb. Because the edges 562a-562c, 564a-564b of the output signal 560 are separated by the periods T1ab-T1cb, which are greater than the periods T2ab-T2cb, the timer 342 reaches its terminal count before it is reset by another edge of the output signal 510, and therefore, PDR pulses 566a-566c are generated.

Pulses 566a-566c can correspond, for example, to the PDR (or CDR) pulses of FIG. 8.

The pulses 566a-566c are shown as solid lines to indicate that the pulses do occur at the times t6b, t7b, t8b, respectively. The timer 342 is reset by edges of the output signal 560 at times t1b-t5b.

Essentially, the input signal 554 has a frequency sufficiently low to keep the circuit in the second mode of operation, in which the PDR pulses 566a-566c do occur.

As described above, the PDR pulses 566a-566c operate to force a voltage on the capacitor, for example, the capacitor 320 of FIG. 8, to substantially equal the input voltage, for example, the input voltage at input node 304a of FIG. 8. Therefore, it should be recognized that the PDR pulses 566a-566c have no effect on the capacitor voltage, which already tracks the input signal at times when the PDR pulses 566a-566c occur. However, this is but one example, and in another example shown in FIG. 12 below, the PDR pulses occur at times associated with one or more of the held capacitor voltages 556a-556c and 558a-558b, resulting in undesirable effects.

Figure 12:
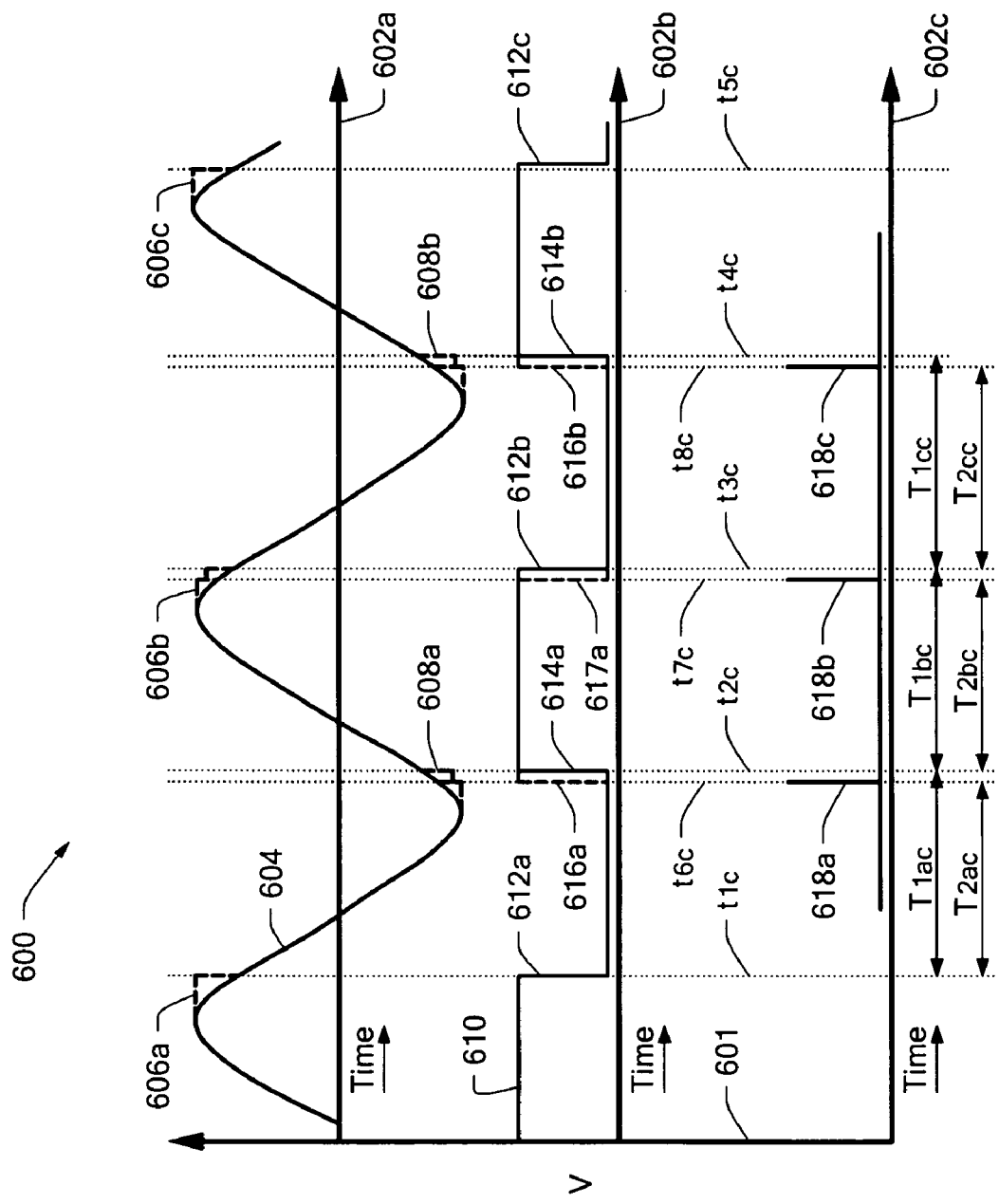
FIG. 12 is a graph showing still further details of the operation of the circuits of FIGS. 2, 5, and 8.

Referring now to FIG. 12, a graph 600 has horizontal scales 602a-602c in units of time and a vertical scale 601 in units of volts. A slowly varying input signal 604 can correspond, for example, to the input signal 302a of FIG. 8 having a period sufficiently long to result in the circuit 300 of FIG. 8 being in the above-described second mode of operation. In the second mode of operation, the PDR pulses are generated at the logic circuit output node 338b of the logic circuit 338.

Held capacitor voltages 606a-606c can correspond, for example, to a voltage at the first threshold node 320a of FIG.

8 when the threshold node 320a holds a positive peak value of the input signal 604. Held capacitor voltages 608a-608b can correspond, for example, to a voltage at the first threshold node 320a of FIG. 8 when the threshold node 320a holds a negative peak value of the input signal 604. It should be understood that the capacitor voltage at other times, for example, at times between the held capacitor voltages 606a and 608a, tracks the input signal 604.

An output signal 610 can correspond, for example, to the comparator output signal 360 of FIG. 8. The output signal 610 has falling edges 612a-612c at times t1c, t3c, and t5c. Each falling edge 612a-612c is indicative of a time when the held capacitor voltages 606a-606c deviate by a predetermined amount from the input signal 604. The output signal 610 has rising edges 614a-614b at times t2c and t4c, respectively. Each rising edge 614a-614b is indicative of a time when the held capacitor voltages 608a-608b deviate by a predetermined amount from the input signal 604. Therefore, the output signal 610 has edges indicative of the positive and negative peaks of the input signal 604 and a frequency indicative of a frequency of the input signal 604.

As described above, at each edge 612a-612c, 614a-614b of the output signal 610, the timer 342 (FIG. 8) is reset, starting a new count. Periods T1ac-T1cc correspond to periods of respective half cycles of the output signal 610. Periods T2ac-T2cc correspond to times for the timer 342 to count to its terminal count, at which time a PDR pulse would be generated. The periods T1ac-T1cc are greater than the periods T2ac-T2cc. Because the edges 612a-612c, 614a-614b of the output signal 610 are separated by the periods T1ac-T1cc, which are greater than the periods T2ac-T2cc, the timer 342 reaches its terminal count before it is reset by another edge of the output signal 610, and therefore, PDR pulses 618a-618c are generated.

Pulses 618a-618c can correspond, for example, to the PDR (or CDR) pulses of FIG. 8. The pulses 618a-618c are shown as solid lines to indicate that the pulses do occur at times t6c, t7c, and t8c, respectively. The timer 342 is reset by edges of the output signal 610 at times t1c-t5c.

Essentially, the input signal 604 has a frequency sufficiently low to keep the circuit in the second mode of operation, in which the PDR pulses 618a-618c do occur.

As described above, the PDR pulses 618a-618c operate to force a voltage on the capacitor, for example, the capacitor 320 of FIG. 8, to substantially equal the input voltage, for example, the input voltage at input node 304a of FIG. 8. Therefore, it should be recognized that the PDR pulses 618a-618c have an effect on the held capacitor voltages 608a, 606b, 608b, which do not track the input signal 604 at times when the PDR pulses 618a-618c occur.

Taking the capacitor voltage 606b as an example, when the PDR pulse 618b occurs, the capacitor voltage 606b is temporarily forced to equal a voltage of the input signal 604. It will be understood from the discussion of the circuit 300 of FIG. 8 that, after the PDR pulse 618b terminates, the capacitor voltage 606b is again held until it deviates by a predetermined amount from the input signal 604, at which time an edge 612b occurs in the output signal 610. The edge 612b is delayed by the above-described action of the PDR pulse 618b to occur at the time t3c, and would have otherwise have occurred at or near the time t7c. Therefore, the edges 616a, 616b, and 617a would otherwise have occurred, in place of the edges 614a, 614b, and 612b, respectively.

From the above discussion, it will be recognized that it is undesirable to allow the PDR pulses 618a-618c to occur during a holding time, i.e., at a time of the held capacitor voltages 606a-606c, 606a-606b. A circuit described in FIG. 13 can be used to overcome this undesirable behavior.

Figure 13:
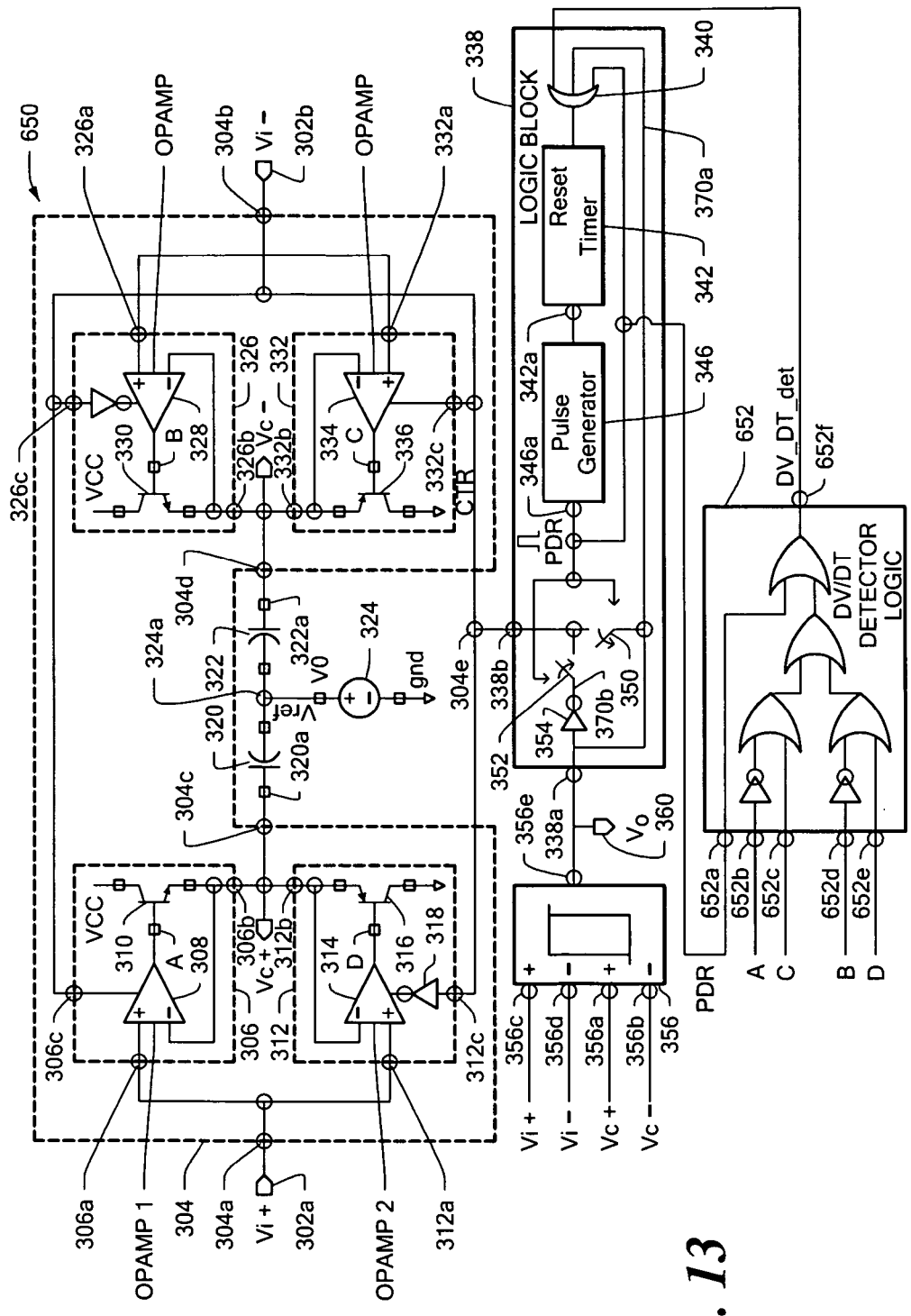
FIG. 13 is a block diagram of a circuit able to detect positive and negative peaks of an input signal in accordance with yet a further embodiment of the invention.

Referring now to FIG. 13, in which like elements of FIG. 8 are shown having like reference designations, a circuit 650 includes a logic circuit 652 having input nodes 652a-652e and an output node 652f. When referring to the circuit 650 of FIG. 13 and the graph 700 of FIG. 14, the logic circuit 652 can be referred to as a "first logic circuit," and the logic circuit 338, can be referred to as a "second logic circuit." The second logic circuit 338 includes a so-called "commutation circuit" comprised of the switches 352, 350 and the inverter 354. The output node 338b can be referred to as a "second logic circuit output node." The logic circuit 652 provides a logic circuit output signal (DV_DT_det) at the logic circuit output node 652f indicative of a slope of the input signal 302a, Vi+, at the input node 304a and a slope of the inverted input signal 302b, Vi−, at the inverted input node 304b. The output signal (DV_DT_det) has a negative edge when a zero slope is detected in either of the input signals, Vi+, Vi−, which corresponds to a positive or a negative peak of the input signals, Vi+, Vi−. It should be understood that the positive or negative peak of the input signals, Vi+, Vi− corresponds to a voltage being held at one of the threshold nodes, 320a, 322a, respectively, which also corresponds to a voltage on one of the capacitors 320, 322, respectively, reaching a positive or a negative peak, which further corresponds to a slope of a voltage on one of the capacitors 320, 322, respectively, becoming zero at the start of an associated hold time. The output signal (DV_DT_det) holds the LOW state while the voltage at the first or second threshold nodes 320a, 322a is held. In other words, the output signal (DV_DT_det) holds the LOW state while the charging circuit 306 is not charging the capacitor 320 at the same time that the discharging circuit 312 is not discharging the capacitor 320. Also, the output signal (DV_DT_det) holds the LOW state while the charging circuit 326 is not charging the capacitor 322 at the same time that the discharging circuit 332 is not discharging the capacitor 322. Because the first logic circuit 652 is coupled to receive inputs from the points A-D, it will be apparent that the first logic circuit 652 is responsive to conditions of the charging circuits 306, 326 and discharging circuits 312, 332 as described above. When the voltage at the first or second threshold nodes 320a, 322a again tracks the associated input signal Vi+, Vi− and the output comparator switches accordingly, the output signal (DV_DT_det) has a positive edge.

In order to achieve the above-described behavior, the logic circuit 652 is coupled to one or more of the amplifiers 308, 314, 328, 334, either directly as shown, or through intermediate level shifters (not shown) and/or comparators (not shown). Taking amplifier 308 as indicative of the other amplifiers 314, 328, 334, when the charging circuit 306 is operating to track the input signal, Vi+, at the input node 304a, the amplifier 308 has an output voltage related to the input signal, Vi+ and also related to the capacitor voltage at the first threshold node 320a. Immediately after the positive peak of the input signal, Vi+, is reached, the voltage at the first threshold node 320a is held, the charging circuit 306 stops tracking the input signal, Vi+, and the amplifier 308 goes open loop, resulting in a negative voltage transition at a node, A. The amplifier 314 similarly generates a positive voltage transition at a node, D, immediately after a negative peak of the input signal, Vi+, is reached and the voltage at the first threshold node 320a is held. These transitions are detected by the logic circuit 652, which generates a negative edge at the logic circuit output node 652f in response to both of the transitions.

In some embodiments, the logic circuit 652 is coupled to all four of the amplifiers 308, 314, 328, 334 as shown. In other embodiments, the logic circuit is coupled to only two of the amplifiers, for example to amplifiers 308 and 314 or to amplifiers 328 and 334.

The DV_DT_det signal holds the timer 342 in reset (i.e., not counting) except for time periods associated with detections of a zero slope of the input signal, Vi+, and detections of a zero slope of the inverted input signal, Vi− (i.e., except for time periods during which the voltages at the first or second threshold nodes are held). Therefore, the timer 342 is reset by a state of the DV_DT_det signal. This reset of the timer 342 is advantageous to overcome the undesirable behavior described in conjunction with FIG. 12. The timer 342 is also reset by transitions of the output signal 360, Vo, and by a state of the PDR signal as described, for example, in conjunction with FIG. 8.

Operation of the logic circuit 652 is described below in greater detail in conjunction with FIG. 14.

While the logic circuit 652 is shown and described in conjunction with a differential peak detector circuit having four amplifiers such as the circuit 300 of FIG. 8, it will be understood that a logic circuit similar to the logic circuit 652 can be used in conjunction with the circuits 50, 150 of FIGS. 2 and 5, respectively. In this case, it will be clear what modification to the logic circuit 652 is needed.

While the logic circuit 652 is described herein to provide a high state, which holds the timer 342 in reset, it should be appreciated that, in other embodiments, the logic can be reversed and the timer 342 can instead be held in reset by a low state of the DV_DT_det signal.

Figure 14:
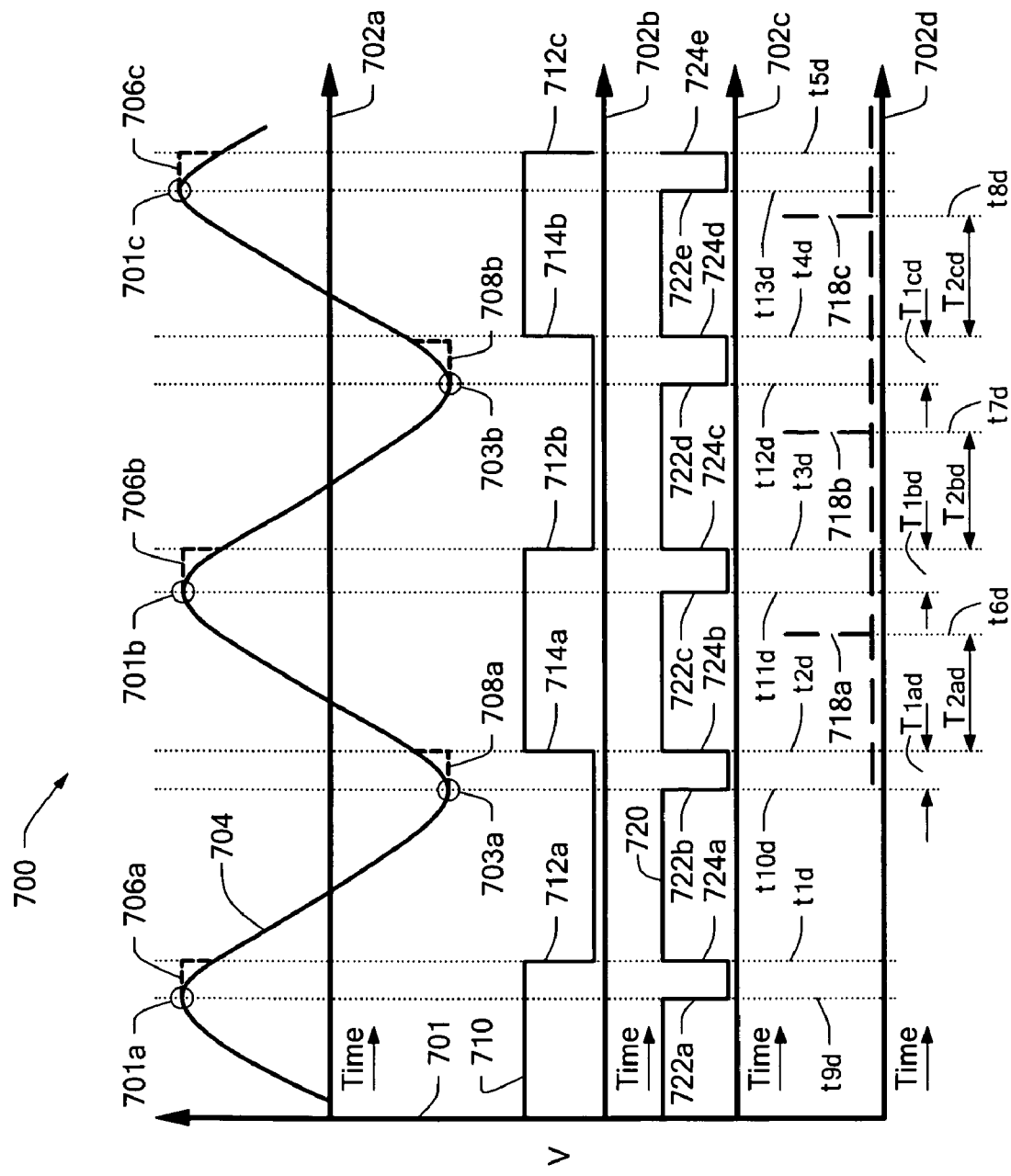
FIG. 14 is a graph showing details of the operation of the circuit of FIG. 13.

Referring now to FIG. 14, a graph 700 has horizontal scales 702a-702d in units of time and a vertical scale 701 in units of voltage. A slowly varying input signal 704 can correspond, for example, to the input signal 302a of FIG. 13. Unlike the circuit 300 of FIG. 8, which enters the second mode of operation (i.e., generates PDR pulses) in the presence of a slowly varying input signal (e.g., input signal 604, FIG. 12), due to operation of the logic circuit 652 (FIG. 13), the circuit 650 of FIG. 13 remains in the first mode of operation (i.e., generates no PDR pulses) in the presence of the slowly varying input signal 704 for reason discussed more fully below. The input signal 604 of FIG. 12 and the input signal 704 have comparable frequencies in the above comparison.

As described above in conjunction with FIG. 12, it is undesirable to allow PDR pulses to occur at times when the voltages on the capacitors 320, 322 (FIG. 13) are being held. It will, however, become apparent from discussion below that the logic circuit 652 (FIG. 13) tends to prevent the PDR pulses from occurring at times when the voltages on the capacitors 320, 322 (FIG. 13) are being held (i.e., during periods in which peaks of the input signal are being detected).

Held capacitor voltages 706a-706c can correspond, for example, to a voltage at the first threshold node 320a of FIG. 13 when the threshold node 320a holds a positive peak value of the input signal 704. Held capacitor voltages 708a-708b can correspond, for example, to a voltage at the first threshold node 320a of FIG. 13 when the first threshold node 320a holds a negative peak value of the input signal 704. It should be understood that the capacitor voltage at other times, for example, at times between the held capacitor voltages 706a and 708a, tracks the input signal 704.

An output signal 710 can correspond, for example, to the comparator output signal 360 of FIG. 13. The output signal 710 has falling edges 712a-712c at times t1d, t3d, and t5d, respectively. Each falling edge 712a-712c is indicative of a time when the held capacitor voltages 706a-706c deviate by a predetermined amount from the input signal 704. The output signal 710 has rising edges 714a-714b at times t2d and t4d, respectively. Each rising edge 714a-714b is indicative of a time when the held capacitor voltages 708a-708b deviate by a predetermined amount from the input signal 704. Therefore, the output signal 710 has edges indicative of the positive and negative peaks of the input signal 704 and a frequency indicative of a frequency of the input signal 704.

A signal 720 corresponds to the DV_DT_det signal of FIG. 13. The signal 720 has falling edges 722a-722e at times t9d, t10d, t11d, t12d, t13d, which are generally coincident with and synchronized with positive and negative peaks 701a-701c, 703a, 703b of the input signal 704, and which are also generally coincident with and synchronized with times at which the held capacitor voltages 706a-706c, 708a, 708b are initially being held. The signal 720 has rising edges 724a-724e at times t1d, t2d, t3d, t4d, t5d, which are generally synchronized with positive and negative peaks 701a-701c, 703a, 703b of the input signal 704, and which are also generally coincident with and synchronized with times at which the held capacitor voltages 706a-706c, 708a, 708b are initially no longer being held and again begin to track the input signal 704.

Pulses 718a-718c can correspond, for example, to the PDR (or CDR) pulses of FIG. 13. The pulses 718a-718c are shown as phantom lines to indicate that the pulses 718a-718c do not actually occur at times t6d-t8d, respectively, but would occur were it not for operation of the output signal 720 (DV_DT_det). Recalling that the timer 342 (FIG. 13) is held in reset by a state (e.g., a high sate) of the output signal 720 (DV_DT_det), then the PDR pulses 718a-718c cannot occur.

As described above, at each high state of the DV_DT_det signal 720, the timer 342 (FIG. 13) is held in reset. Therefore, when the DV_DT_det signal 720 is high, the counter 342 does not count and no PDR pulses are generated.

Periods T1ad-T1cd correspond to low periods of the DV_DT_det signal 720, which generally coincide with times during which the held capacitor voltages 706a-706c, 708a-708b are being held. Periods T2ad-T2cd correspond to times for the timer 342 to count to its terminal count in the absence of the logic circuit 652 of FIG. 13, at which times a PDR pulse 718a-718c would be generated were it not for the operation of the DV_DT_det signal 720, which goes high during the periods T2ad-T2cd, holding the timer 342 in reset.

As described above, the PDR pulses 718a-718c would operate to force a voltage on the capacitors, for example, the capacitors 320, 322 of FIG. 13, to substantially equal the respective input voltage, for example, the input voltages at input nodes 304a, 304b, respectively, of FIG. 13. However, because the DV_DT_det signal 720 holds the timer 342 in reset during the entire high state of the DV_DT_det signal 720, the timer 342 can count only during times when the DV_DT_det signal 720 is at a low state, which corresponds to a time when the held capacitor voltages 706a-706c, 708a-708b are in a holding condition.

The logic circuit 652 of FIG. 13 can overcome the undesirable behavior described above in conjunction with FIG. 12, by providing the DV_DT_det signal 720. The DV_DT_det signal 720 only allows PDR pulses to occur when the DV_DT_det signal 720 is in a low state and the low state of the DV_DT_det signal 720 has sufficient duration that the counter 342 reaches its desired count value during the low state. Essentially, the PDR pulses 718a-718c can only occur within the holding time, i.e., during the time of the held capacitor voltages 706a-706c, 708a-708b, for an input signal 704 having a frequency substantially lower than that shown.

It should be understood that the duration (i.e., count rate and desired terminal count) provided by the timer 342 (FIG. 13) is selected in accordance with a voltage drift on the capacitors 320, 322 (FIG. 13). Comparing FIG. 12 with FIG. 14, the terminal count of the timer 342 corresponds to the periods T2*ac*-T2*cc* of FIG. 12 and to periods T2*ad*-T2*cd* of FIG. 14. Therefore, in order for the circuit 650 of FIG. 13 to exhibit the undesirable behavior described above in conjunction with FIG. 12, it would be necessary for the periods T1*ad*-T1*cd* to be long, i.e., as long as the periods T2*ad*-T2*cd*. This condition only occurs if the input signal 704 is more slowly varying than shown. Therefore, the circuit 650 of FIG. 13 can operate to a substantially lower input signal frequency than the circuit 300 of FIG. 8 before the undesirable behavior (e.g., FIG. 12) appears. In one particular arrangement, the circuit 650 can operate to an input signal frequency ten times lower than the circuit 300 of FIG. 8.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A circuit, comprising:
   a track-and-hold circuit comprising:
      a capacitor having a threshold node;
      a charging circuit to charge the capacitor; and
      a discharging circuit to discharge the capacitor, wherein the track-and-hold circuit is configured to track an input signal and to hold respective capacitor voltages on the threshold node in accordance with positive and negative peaks of the input signal, wherein the track-and-hold circuit has an output node at which an output signal is provided in accordance with the positive and negative peaks of the input signal; and
   a first logic circuit configured to provide a first logic circuit output signal at a first logic circuit output node having a transition indicative of no charging of the capacitor by the charging circuit at the same time as no discharging of the capacitor by the discharging circuit, wherein the first logic circuit output signal is configured to control the track-and-hold circuit.

2. The circuit of claim 1, wherein the charging circuit comprises:
   a charging circuit input node to receive the input signal and a charging circuit output node coupled to the threshold node, wherein the charging circuit is adapted to provide a charging signal at the charging circuit output node to charge the capacitor to a capacitor-positive-peak voltage in accordance with a positive peak of the input signal, the charging circuit further having a charging-circuit-slope node at which a charging-circuit-slope signal is generated indicative of a slope of the capacitor-positive-peak voltage, and wherein the discharging circuit comprises:
   a discharging circuit having a discharging circuit input node to receive the input signal and a discharging circuit output node coupled to the threshold node, wherein the discharging circuit is adapted to provide a discharging signal at the discharging circuit output node to discharge the capacitor to a capacitor-negative-peak voltage in accordance with a negative peak of the input signal, the discharging circuit further having a discharging-circuit-slope node at which a discharging-circuit-slope signal is generated indicative of a slope of the capacitor-negative-peak voltage, wherein the circuit further comprises:
   a comparator having a first comparator input node coupled to the threshold node, a second comparator input node coupled to the input node of the at least one of the charging circuit or the discharging circuit, and a comparator output node at which a comparator output signal is provided.

3. The circuit of claim 2, further comprising a second logic circuit having a second logic circuit input node coupled to the first logic circuit output node and a second logic circuit PDR node at which a second logic circuit PDR signal is provided indicative of a predetermined time period during which the output signal has no transitions.

4. The circuit of claim 3, further comprising a switch having a first switch node coupled to the threshold node, a second switch node coupled to the input signal, and a switch control node coupled to the second logic circuit PDR node.

5. The circuit of claim 4, wherein the switch is adapted to force a voltage on the capacitor to substantially equal a voltage in accordance with the input signal in response to the second logic circuit PDR signal.

6. The circuit of claim 3, further comprising a commutation circuit having a first commutation circuit node coupled to the track-and-hold circuit, a second commutation circuit node coupled to the comparator output node, and a third commutation circuit node coupled to receive the second logic circuit PDR signal.

7. The circuit of claim 6, wherein the commutation circuit is adapted to force a voltage on the capacitor to substantially equal a voltage in accordance with the input signal in response to the second logic circuit PDR signal.

8. The circuit of claim 3, wherein the second logic circuit comprises:
   a timer to generate a timer signal; and
   a pulse generator coupled to the timer to generate a pulse associated with the second logic circuit PDR signal in response to the timer signal.

9. The circuit of claim 3, wherein the capacitor and at least one of the track-and-hold circuit, the first logic circuit, or the second logic circuit are provided on a common substrate.

10. A circuit, comprising:
    a capacitor having a threshold node;
    at least one of:
       a charging circuit having a charging circuit input node to receive an input signal and a charging circuit output node coupled to the threshold node, wherein the charging circuit is adapted to provide a charging signal at the charging circuit output node to charge the capacitor to a capacitor-positive-peak voltage in accordance with a positive peak of the input signal, the charging circuit further having a charging-circuit-slope node at which a charging-circuit-slope signal is provided indicative of a slope of the capacitor-positive-peak voltage, or a discharging circuit having a discharging circuit input node to receive the input signal and a discharging circuit output node coupled to the threshold node, wherein the discharging circuit is adapted to provide a discharging signal at the discharging circuit output node to discharge the capacitor to a capacitor-negative-peak voltage in accordance with a negative peak of the input signal, the discharging circuit further having a discharging-circuit-slope node at which a discharging-circuit-slope signal is provided indicative of a slope of the capacitor-negative-peak voltage;
    a comparator having a first comparator input node coupled to the threshold node, a second comparator input node coupled to the input node of the at least one of the charging circuit or the discharging circuit, and a comparator output node at which a comparator output signal is provided;

a first logic circuit having at least one first logic circuit input node coupled to at least one of the charging-circuit-slope node or the discharging-circuit-slope node and having a first logic circuit output node at which a first logic circuit output signal is provided indicative of the slope of at least one of the capacitor-positive-peak voltage or the capacitor-negative-peak voltage; and a second logic circuit having a second logic circuit input node coupled to the comparator output node, another second logic circuit input node coupled to the first logic circuit output node, and a second logic circuit PDR node at which a second logic circuit PDR signal is provided indicative of a predetermined period of time during which the comparator output signal has no transitions and further indicative of a predetermined period of time during which the at least one of the capacitor-positive-peak voltage or the capacitor-negative-peak voltage has a slope approximately equal to zero.

11. The circuit of claim 10, further comprising a switch having a first switch node coupled to the threshold node, a second switch node coupled to the input signal, and a switch control node coupled to the second logic circuit PDR node.

12. The circuit of claim 11, wherein the switch is adapted to force a voltage on the capacitor to substantially equal a voltage in accordance with the input signal in response to the second logic circuit PDR signal.

13. The circuit of claim 10, wherein the second logic circuit comprises a commutation circuit, wherein the commutation circuit includes a first commutation circuit node coupled to the at least one of the charging circuit or the discharging circuit, a second commutation circuit node coupled to the comparator output node, and a third commutation circuit node coupled to receive the second logic circuit PDR signal.

14. The circuit of claim 13, wherein the commutation circuit is adapted to force a voltage on the capacitor to substantially equal a voltage in accordance with the input signal in response to the second logic circuit PDR signal.

15. The circuit of claim 10, wherein the second logic circuit comprises:

a timer to generate a timer signal; and a pulse generator coupled to the timer to generate a pulse associated with the second logic circuit PDR signal in response to the timer signal.

16. The circuit of claim 10, wherein the capacitor and at least one of the charging circuit and the discharging circuit, the comparator, the first logic circuit, or the second logic circuit are provided on a common substrate.

17. A circuit, comprising:

a first capacitor having a first threshold node;

a second capacitor having a second threshold node;

a charging/discharging circuit having at least two charging/discharging circuit input nodes to receive an input signal and an inverted input signal, at least two charging/discharging circuit output nodes coupled respectively to the first threshold node and to the second threshold node, and an enable/disable node, wherein the charging/discharging circuit is adapted to provide charging signals at the at least two charging/discharging circuit output nodes to charge the first capacitor to a first-capacitor-positive-peak voltage in accordance with a positive peak of the input signal and to charge the second capacitor to a second-capacitor-positive-peak voltage in accordance with a positive peak of the inverted input signal, and wherein the charging/discharging circuit is adapted to provide discharging signals at the at least two charging/discharging circuit output nodes to discharge the first capacitor to a first-capacitor-negative-peak voltage in accordance with a negative peak of the input signal and to discharge the second capacitor to a second-capacitor-negative-peak voltage in accordance with a negative peak of the inverted input signal, wherein the charging/discharging circuit further has at least one charging/discharging-circuit-slope node at which a respective at least one charging/discharging-circuit-slope signal is provided indicative of a slope of at least one of the first-capacitor-positive-peak voltage, the second-capacitor-positive-peak voltage, the first-capacitor-negative-peak voltage, or the second-capacitor-negative-peak voltage;

a comparator having first differential comparator input nodes coupled to the first and second threshold nodes, second differential comparator input nodes coupled to respective ones of the at least two charging/discharging circuit input nodes, and a comparator output node at which a comparator output signal is provided;

a first logic circuit having at least one first logic circuit input node coupled to the at least one charging/discharging-circuit-slope node and having a first logic circuit output node at which a first logic circuit output signal is provided in response to a slope of the at least one of the first-capacitor-positive-peak voltage, the second-capacitor-positive-peak voltage, the first-capacitor-negative-peak voltage, or the second-capacitor-negative-peak voltage; and a second logic circuit having a second logic circuit input node coupled to the comparator output node, another second logic circuit input node coupled to the first logic circuit output node, and a second logic circuit PDR node coupled to the enable/disable node, wherein a second logic circuit PDR signal is provided at the second logic circuit PDR node indicative of a predetermined period of time during which the comparator output signal has no transitions and further indicative of a predetermined period of time during which the at least one of the first-capacitor-positive-peak voltage, the second-capacitor-positive-peak voltage, the first-capacitor-negative-peak voltage, or the second-capacitor-negative-peak voltage has a slope approximately equal to zero.

18. The circuit of claim 17, wherein the charging/discharging circuit comprises:

a first charging circuit having a first charging circuit input node to receive the input signal, a first charging circuit output node coupled to the first threshold node, and a first charging circuit enable input node coupled to a second logic circuit output node;

a first discharging circuit having a first discharging circuit input node to receive the input signal, a first discharging circuit output node coupled to the first threshold node, and a first discharging circuit inverted enable input node coupled to the second logic circuit output node;

a second charging circuit having a second charging circuit input node to receive the inverted input signal, a second charging circuit output node coupled to the second threshold node, and a second charging circuit inverted enable input node coupled to the second logic circuit output node; and a second discharging circuit having a second discharging circuit input node to receive the inverted input signal, a second discharging circuit output node coupled to the second threshold node, and a second discharging circuit enable input node coupled to the second logic circuit output node, wherein the first charging circuit is adapted to provide a first charging signal at the first charging circuit output node to charge the first capacitor, the first discharging circuit is adapted to provide a first discharging signal at the first discharging circuit output node to discharge the first capacitor, the second charging circuit is adapted to provide a second charging signal at the second charging circuit output node to charge the second capacitor, and the second discharging circuit is adapted to provide a second discharging signal at the second discharging circuit output node to discharge the second capacitor.

19. The circuit of claim 17, wherein the charging/discharging circuit is adapted to force a voltage on the first capacitor to substantially equal a voltage in accordance with the input signal and to force a voltage on the second capacitor to substantially equal a voltage in accordance with the inverted input signal in response to the second logic circuit PDR signal.

20. The circuit of claim 17, wherein the second logic circuit comprises:
   a timer to generate a timer signal; and
   a pulse generator coupled to the timer to generate a pulse associated with the second logic circuit PDR signal in response to the timer signal.

21. The circuit of claim 17, wherein the second logic circuit further comprises: a commutation circuit having a first commutation circuit node coupled to the enable/disable node, a second commutation circuit node coupled to the comparator output node, and a third commutation circuit node coupled to the second logic circuit PDR node.

22. The circuit of claim 21, wherein the commutation circuit is adapted to force a voltage on the first capacitor to substantially equal a voltage in accordance with the input signal in response to the second logic circuit PDR signal and the commutation circuit is further adapted to force a voltage on the second capacitor to substantially equal a voltage in accordance with the inverted input signal in response to the second logic circuit PDR signal.

23. The circuit of claim 21, wherein the first capacitor, the second capacitor, and at least one of the charging/discharging circuit, the comparator, the first logic circuit, the second logic circuit, or the commutation circuit are provided on a common substrate.

24. The circuit of claim 17, wherein the first capacitor, the second capacitor, and at least one of the charging/discharging circuit, the comparator, the first logic circuit, or the second logic circuit are provided on a common substrate.

* * * * *

UNITED STATES PATENT AND TRADEMARK OFFICE
CERTIFICATE OF CORRECTION

PATENT NO. : 7,518,414 B2
APPLICATION NO. : 11/216651
DATED : April 14, 2009
INVENTOR(S) : Hernan D. Romero et al.

It is certified that error appears in the above-identified patent and that said Letters Patent is hereby corrected as shown below:

Column 2, line 17 delete "in accordance the" and replace with --in accordance with the--.

Column 2, line 43 delete "results" and replace with --result--.

Column 4, line 26 delete "charging/dischargingcircuit" and replace with --charging/discharging circuit--.

Column 11, line 60 delete "on" and replace with --one--.

Column 12, line 2 delete "to minimum" and replace with --to a minimum--.

Column 13, line 36 delete "the" and replace with --a--.

Column 23, line 40 delete "reason" and replace with --reasons--.

Column 24, line 28 delete "sate)" and replace with --state)--.

Signed and Sealed this

Seventeenth Day of November, 2009

David J. Kappos
*Director of the United States Patent and Trademark Office*